United States Patent
Kim et al.

(10) Patent No.: US 11,527,740 B2
(45) Date of Patent: Dec. 13, 2022

(54) DISPLAY DEVICE COMPRISING STACK OF INSULATING REFRACTIVE LAYERS

(71) Applicant: Samsung Display Co., LTD., Yongin-si (KR)

(72) Inventors: Woongsik Kim, Hwaseong-si (KR); Ji-Hyun Kim, Hwaseong-si (KR); Saehee Han, Seoul (KR); Jongbeom Hong, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 308 days.

(21) Appl. No.: 16/886,039

(22) Filed: May 28, 2020

(65) Prior Publication Data

US 2021/0005846 A1   Jan. 7, 2021

(30) Foreign Application Priority Data

Jul. 2, 2019  (KR) .......................... 10-2019-0079385

(51) Int. Cl.
  *H01L 51/52* (2006.01)
  *H01L 27/32* (2006.01)

(52) U.S. Cl.
  CPC ...... *H01L 51/5275* (2013.01); *H01L 27/3244* (2013.01)

(58) Field of Classification Search
  CPC combination set(s) only.
  See application file for complete search history.

(56) References Cited

U.S. PATENT DOCUMENTS

| | | |
|---|---|---|
| 9,318,726 B2 | 4/2016 | Choi et al. |
| 9,406,724 B2 | 8/2016 | Choi et al. |
| 9,774,011 B2 | 9/2017 | Choi et al. |
| 10,084,024 B2 | 9/2018 | Choi et al. |
| 10,224,377 B2 | 3/2019 | Park et al. |
| 10,361,253 B2 | 7/2019 | Choi et al. |
| 10,388,913 B2 | 8/2019 | Jung et al. |
| 10,608,054 B2 | 3/2020 | Choi et al. |

(Continued)

FOREIGN PATENT DOCUMENTS

| | | |
|---|---|---|
| JP | 2013-191464 | 9/2013 |
| JP | 2015-176132 | 10/2015 |

(Continued)

*Primary Examiner* — Nduka E Ojeh
(74) *Attorney, Agent, or Firm* — Kile Park Reed & Houtteman PLLC

(57) ABSTRACT

Provided is a display device including a display panel including light emitting regions and a non-light emitting region adjacent to the light emitting regions, a first insulation layer disposed on the display panel, the first insulation layer having a first refractive index, and having first openings defined in a region overlapping the light emitting regions, a second insulation layer covering the display panel and the first insulation layer and having a second refractive index greater than the first refractive index of the first insulation layer, a third insulation layer disposed on the second insulation layer, the third insulation layer having the first refractive index, and having second openings defined in a region overlapping the light emitting regions, and a fourth insulation layer covering the second insulation layer and the third insulation layer and the fourth insulation layer having the second refractive index.

12 Claims, 17 Drawing Sheets

(56) References Cited

U.S. PATENT DOCUMENTS

| | | |
|---|---|---|
| 10,651,428 B2 | 5/2020 | Jung et al. |
| 2018/0138458 A1* | 5/2018 | Tokuda ................ H01L 51/524 |
| 2018/0149936 A1 | 5/2018 | Shin et al. |
| 2019/0016505 A1 | 1/2019 | Yoshimura et al. |
| 2019/0019878 A1 | 1/2019 | Yen et al. |
| 2019/0165053 A1 | 5/2019 | Park et al. |
| 2019/0198782 A1 | 6/2019 | Kim et al. |
| 2019/0221778 A1 | 7/2019 | Kim et al. |

FOREIGN PATENT DOCUMENTS

| | | |
|---|---|---|
| KR | 10-2016-0017397 | 2/2016 |
| KR | 10-2016-0027608 | 3/2016 |
| KR | 10-2018-0005323 | 1/2018 |
| KR | 10-2019-0062678 | 6/2019 |
| KR | 10-2019-0078723 | 7/2019 |
| KR | 10-2019-0087689 | 7/2019 |
| TW | 201813153 | 4/2018 |

* cited by examiner

DISPLAY DEVICE COMPRISING STACK OF INSULATING REFRACTIVE LAYERS

CROSS-REFERENCE TO RELATED APPLICATIONS

This application claims priority to and benefits of Korean Patent Application No. 10-2019-0079385 under 35 U.S.C. § 119, filed in the Korean Intellectual Property Office on Jul. 2, 2019, the entire contents of which are incorporated herein by reference.

BACKGROUND

(a) Technical Field

The disclosure herein relates to a display device having improved light efficiency.

(b) Description of the Related Art

A display device may be categorized into a self-light-emitting type display device in which a light emitting element emits light by itself and a light-receiving type display device which controls the transmittance of received light. A self-light-emitting type display device may be, for example, an organic light emitting display device. Light generated in a light emitting layer of an organic light emitting display device may be emitted in the lateral direction as well as in the front direction. Light efficiency may be determined based on light emitted in the front direction. That is, light emitted in the lateral direction may cause a deterioration in light efficiency.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device having improved light efficiency.

An embodiment provides a display device including a display panel including a plurality of light emitting regions and a non-light emitting region adjacent to the plurality of light emitting regions, a first insulation layer disposed on the display panel, the first insulation layer having a first refractive index, and having a plurality of first openings defined in a region overlapping the plurality of light emitting regions, a second insulation layer covering the display panel and the first insulation layer and having a second refractive index greater than the first refractive index of the first insulation layer, a third insulation layer disposed on the second insulation layer, the third insulation layer having the first refractive index and having a plurality of second openings defined in a region overlapping the plurality of light emitting regions, and a fourth insulation layer covering the second insulation layer and the third insulation layer and the fourth insulation layer having the second refractive index.

In an embodiment, each of the second insulation layer and the fourth insulation layer may overlap the plurality of first openings on a plane.

In an embodiment, the first refractive index may be in a range of about 1.45 to about 1.55, and the second refractive index may be in a range of about 1.65 to about 1.80.

In an embodiment, the first insulation layer and the third insulation layer may include a first organic matter, and the second insulation layer and the fourth insulation layer may include a second organic matter different from the first organic matter.

In an embodiment, the first organic matter may include an acrylic resin.

In an embodiment, the second organic matter may include zirconia.

In an embodiment, a thickness of the first insulation layer may be in a range of about 1.5 μm to about 5 μm, and a maximum thickness of the second insulation layer may be in a range of about 3 μm to about 20 μm.

In an embodiment, the first insulation layer may include a first through-surface defining each of the plurality of first openings, and an angle between the first through-surface and a surface on which the first insulation layer is disposed may be in a range of about 60° to about 80°.

In an embodiment, an absolute value of the difference between a width of each of the plurality of first openings and a width of each of the plurality of light emitting regions may be about 3 μm or less.

In an embodiment, the display device may further include a fifth insulation layer disposed on the fourth insulation layer, the fifth insulation layer having the first refractive index, and having a plurality of third openings defined in a region overlapping the plurality of light emitting regions, and a sixth insulation layer covering the fourth insulation layer and the fifth insulation layer and having the second refractive index.

In an embodiment, the plurality of second openings may be extended in a first direction and spaced apart in a second direction crossing the first direction on a plane, and the plurality of third openings may be extended in the second direction and spaced apart in the first direction on the plane.

In an embodiment, the display device may further include an input sensing layer between the display panel and the first insulation layer.

In an embodiment, a display device includes a display panel including a plurality of light emitting regions and a non-light emitting region adjacent to the plurality of light emitting regions, a first insulation layer disposed on the display panel, the first insulation layer having a first refractive index, and having a first opening overlapping the non-light emitting region, a second insulation layer covering the display panel and the first insulation layer and having a second refractive index less than the first refractive index of the first insulation layer, a third insulation layer disposed on the second insulation layer, having the first refractive index, and having a second opening overlapping the non-light emitting region, and a fourth insulation layer covering the second insulation layer and the third insulation layer and the fourth insulation layer having the second refractive index.

In an embodiment, the second insulation layer and the fourth insulation layer may overlap the first opening on a plane.

In an embodiment, the first refractive index may be in a range of about 1.45 to about 1.55, and the second refractive index may be in a range of about 1.1 to about 1.3.

In an embodiment, the first insulation layer and the third insulation layer may include a first organic matter, and the second insulation layer and the fourth insulation layer may include a second organic matter.

In an embodiment, the first organic matter may include porous zirconia.

In an embodiment, the second organic matter may include a porous acrylic resin.

In an embodiment, a thickness of the first insulation layer may be in a range of about 1.5 µm to about 5 µm, and a maximum thickness of the second insulation layer may be in a range of about 3 µm to about 20 µm.

In an embodiment, the first insulation layer may include a first through-surface defining the first opening, and an angle between the first through-surface and the display panel may be in a range of about 90° to about 120°.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
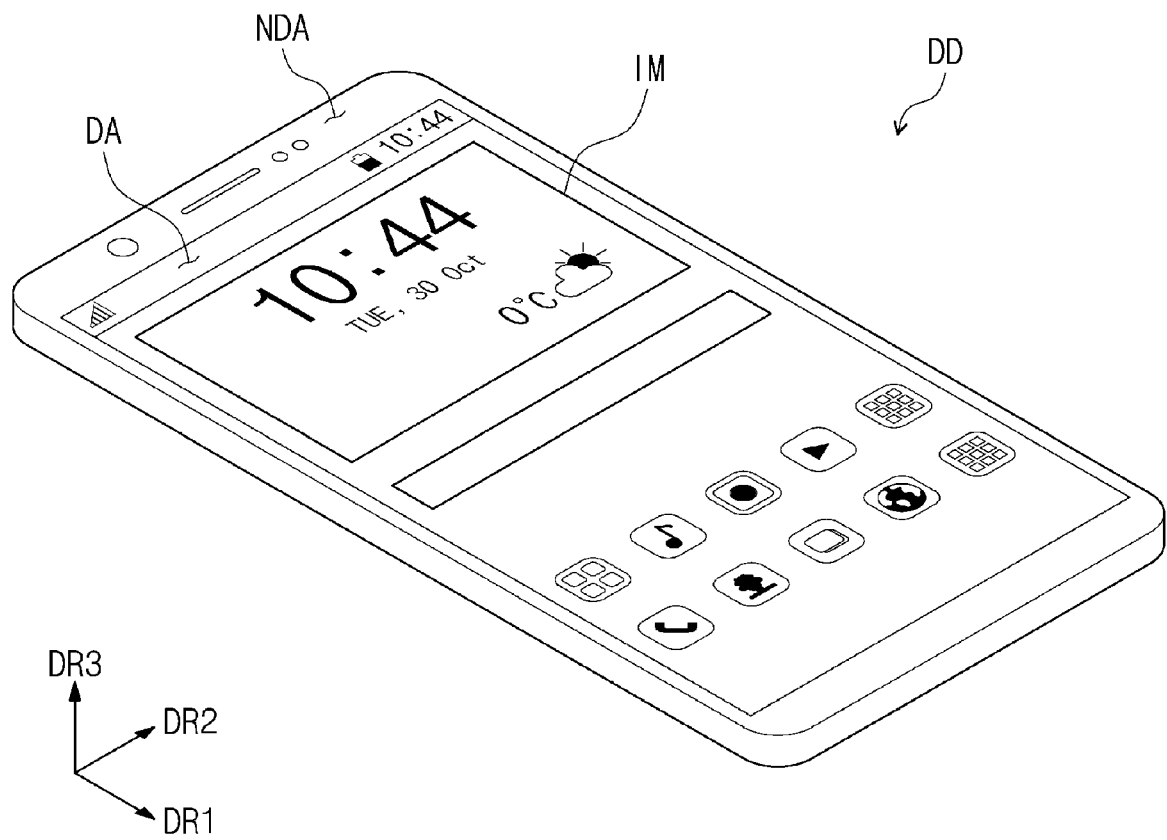
FIG. 1 is a perspective view of a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Some of the parts which are not associated with the description may not be provided in order to describe embodiments and like reference numerals refer to like elements throughout the specification.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. In the drawings, thicknesses, ratios, and dimensions of elements may be exaggerated for an effective description of technical contents and for clarity.

Further, in the specification, the phrase "in a plan view" means when an object portion is viewed from above, and the phrase "in a schematic cross-sectional view" means a schematic cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The term "and/or" includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments. The terms of a singular form may include plural forms unless the context clearly indicates otherwise.

In addition, terms such as "below," "lower," "above," "upper," and the like may be used to describe the relationship of the configurations shown in the drawings. However, these terms are used as a relative concept and although described with reference to the direction indicated in the drawings, embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the relevant art, and are expressly defined herein and will not be interpreted in an ideal or excessively formal sense unless clearly defined in the specification.

It should be understood that the terms "comprise", "include" and "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments will be described with reference to the accompanying drawings.

FIG. 1 is a perspective view of a display device according to an embodiment.

Referring to FIG. 1, a display device DD may be used for large electronic devices such as a television, monitor, and an external advertisement board, and also for small- and medium-sized electronic devices such as a personal computer, a notebook computer, a personal digital terminal, a vehicle navigation system unit, a game machine, a portable electronic apparatus, and a camera. It should be understood, however, that these are merely examples, and the display device DD may be incorporated in other electronic apparatuses without departing from the spirit and scope of the disclosure.

In the display device DD, a display region DA and a non-display region NDA may be defined.

The display region DA on which an image IM is displayed may be parallel to a surface defined by a first direction DR1 and a second direction DR2. The normal direction of the display region DA, that is, the thickness direction of the display device DD may be indicated by a third direction DR3. The front surface (or an upper surface) and the rear surface (or a lower surface) of each member may be distinguished by the third direction DR3. The third direction DR3 may be a direction crossing the first direction DR1 and the second direction DR2. For example, the first direction DR1, the second direction DR2, and the third direction DR3 may be perpendicular to each other.

Meanwhile, directions indicated by the first to third directions DR1, DR2, and DR3 are relative. They may be converted to or represented by different directions. Hereinafter, a first direction to a third direction refer to the same directions indicated by the first to third direction DR1, DR2, and DR3, respectively, and refer to the same reference numerals. In the specification, a surface defined by the first direction DR1 and the second direction DR2 is defined as a plane, and "plan view" or the like may refer to a view shown from the third direction DR3.

The non-display region NDA is a region adjacent to the display region DA, and may be a region on which the image IM is not displayed. A bezel region of the display device DD may be defined by the non-display region NDA.

The non-display region NDA may surround the display region DA. However, the embodiment is not limited thereto. The shape of the display region DA and the shape of the non-display region NDA may be varied in other embodiments.

FIG. 2A to FIG. 2E are schematic cross-sectional views of a display device according to an embodiment. FIG. 2A to FIG. 2E illustrate a cross section depicted in the second direction DR2 and the third direction DR3. FIG. 2A to FIG. 2E are illustrated to describe the lamination relationship of functional members that may constitute the display device DD.

The display device DD according to an embodiment may include a display panel, an optical layer, an anti-reflector, and a window. At least some of the display panel, the optical layer, the anti-reflector, and the window may be formed by a continuous process, or at least some thereof may be coupled to each other through an adhesive member. FIG. 2A to FIG. 2E exemplarily illustrate an optically transparent adhesive member OCA as the adhesive member. The adhesive member described hereinafter may include a typical adhesive or a typical pressure sensitive adhesive. In an embodiment, the anti-reflector and the window may be substituted by other components, or may be omitted.

Figure 2A:
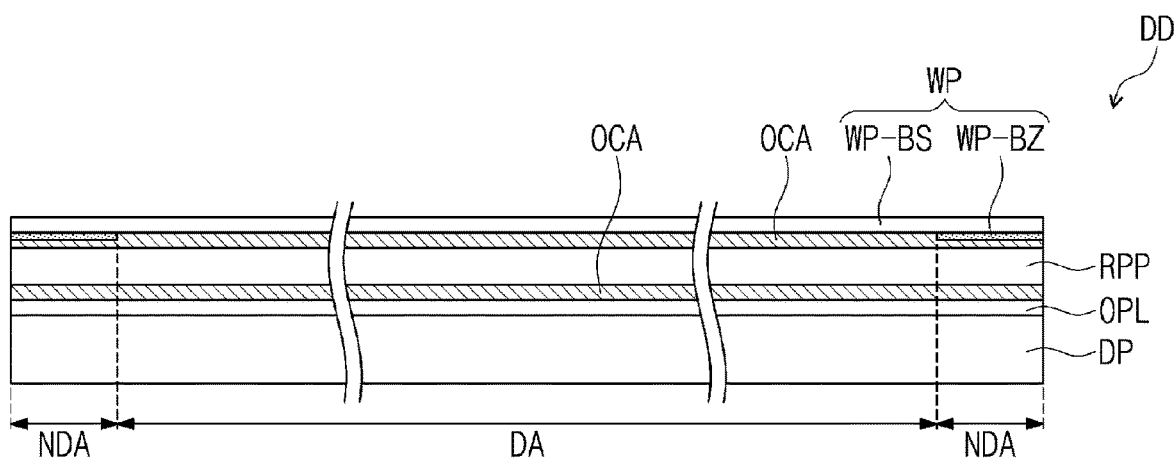
FIG. 2A to FIG. 2E are schematic cross-sectional views of a display device according to an embodiment.

As illustrated in FIG. 2A, the display device DD may include a display panel DP, an optical layer OPL, an anti-reflection panel RPP, and a window panel WP.

The display panel DP may generate the image IM (see FIG. 1). The display panel DP according to an embodiment may be a light-emitting type display panel, but is not particularly limited thereto. For example, the display panel DP may be an organic light emitting display panel or a quantum dot light emitting display panel. A light emitting layer of an organic light emitting display panel may include an organic light emitting material. A light emitting layer of a quantum dot light emitting display panel may include a quantum dot, a quantum rod, and the like. Hereinafter, the display panel DP is described as an organic light emitting display panel.

The optical layer OPL may be disposed on the display panel DP. The optical layer OPL may change the path of light emitted from the display panel DP.

The anti-reflection panel RPP may reduce the reflectance of external light incident from an upper side of the window panel WP. The anti-reflection panel RPP according to an embodiment may include a phase retarder and a polarizer. The phase retarder may be of a film type or a liquid crystal coating type, and may include a λ/2 phase retarder and/or a λ/4 phase retarder. The polarizer may also be of a film type or a liquid crystal coating type. The film type polarizer may include a stretchable synthetic resin film, and the liquid crystal coating type polarizer may include liquid crystals arranged in a predetermined arrangement. The phase retarder and the polarizer may include a protective film. The phase retarder and the polarizer themselves or the protective film may be defined as a base layer of the anti-reflection panel RPP.

The anti-reflection panel RPP according to an embodiment may include color filters. The color filters may have a predetermined arrangement. The arrangement of the color filters may be determined in consideration of the light-emitting colors of pixels included in the display panel DP. The anti-reflection panel RPP may include a black matrix adjacent to the color filters.

The anti-reflection panel RPP according to an embodiment may include an offset-interference structure. For example, the offset-interference structure may include a first reflection layer and a second reflection layer disposed on different layers. A first reflected light and a second reflected light respectively reflected from the first reflection layer and the second reflection layer may be offset-interfered, and accordingly, external light reflectance may be reduced.

The window panel WP according to an embodiment may include a base layer WP-BS and a light-blocking pattern WP-BZ. The base layer WP-BS may include a glass substrate and/or a synthetic resin film. The base layer WP-BS is not limited to a single layer. The base layer WP-BS may include two or more films or layers bonded by the adhesive member.

The light-blocking pattern WP-BZ may overlap or partially overlap the base layer WP-BS. The light-blocking pattern WP-BZ may be disposed on the rear surface of the base layer WP-BS. The light-blocking pattern WP-BZ may substantially define the non-display region NDA of the display device DD. A region on which the light-blocking pattern WP-BZ is not disposed may define the display region DA of the display device DD.

The light-blocking pattern WP-BZ may have a multi-layered structure. The multi-layered structure may include a color layer and a light-blocking layer. The color layer may have a color, and the light blocking layer may be in black. The color layer and the light-blocking layer may be formed, for example, through deposition, printing, and coating processes. Although not separately illustrated, the window panel WP may further include a functional coating layer disposed on the front surface of the base layer WP-BS. The functional coating layer may include, for example, an anti-fingerprint layer, an anti-reflection layer, a hard coating layer, and the like.

Referring to FIG. 2B to FIG. 2E, the display device DD may include an input sensing sensor. In FIG. 2B to FIG. 2E, among the input sensing sensor, the anti-reflector, and the window, a component formed through a continuous process with another component may be referred to as a layer. Among the input sensing sensor, the anti-reflector, and the window, a component bonded to another component through the adhesive member may be referred to as a panel. A panel may include a base layer which provides a base surface, for example, a synthetic resin film, a composite material film, a glass substrate, and the like, but a layer may not have the base layer. In other words, the elements and or members referred to as a layer or layers may be disposed on a base layer which may be provided by or comprised of other elements and or members.

Hereinafter, depending on the presence of a base layer, the input sensing sensor, the anti-reflector, and the window may be respectively referred to as an input sensing panel ISP, the anti-reflection panel RPP, and the window panel WP, or an input sensing layer ISL, an anti-reflection layer RPL, and a window layer WL.

Figure 2B:
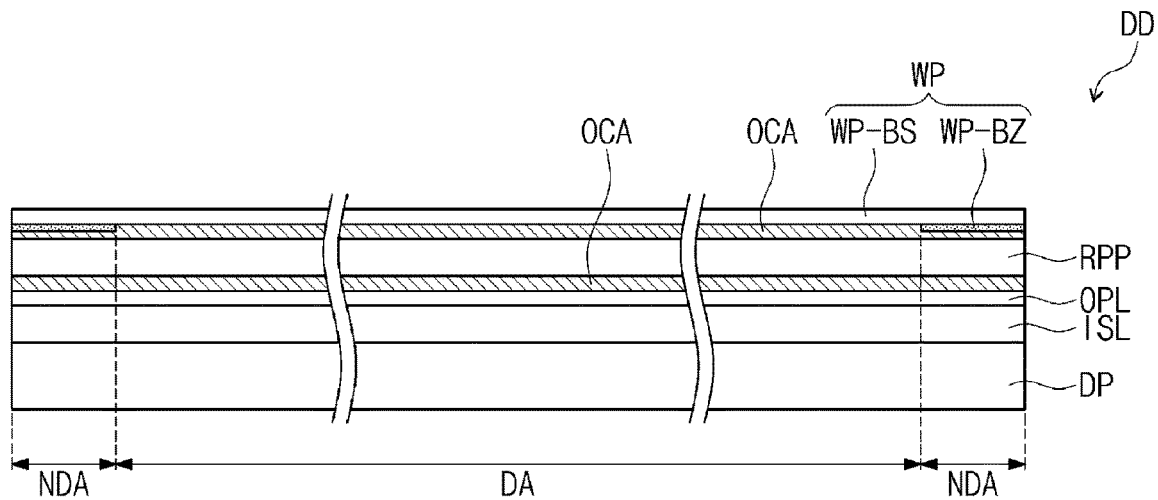

As illustrated in FIG. 2B, the display device DD may include the display panel DP, the input sensing layer ISL, the optical layer OPL, the anti-reflection panel RPP, and the window panel WP. The input sensing layer ISL may be disposed between the display panel DP and the optical layer OPL. The input sensing layer ISL may obtain the coordinate information of an external input (for example, a touch event).

Between the optical layer OPL and the anti-reflection panel RPP, and between the anti-reflection panel RPP and the window panel WP, the optically transparent adhesive member OCA may be disposed.

Figure 2C:
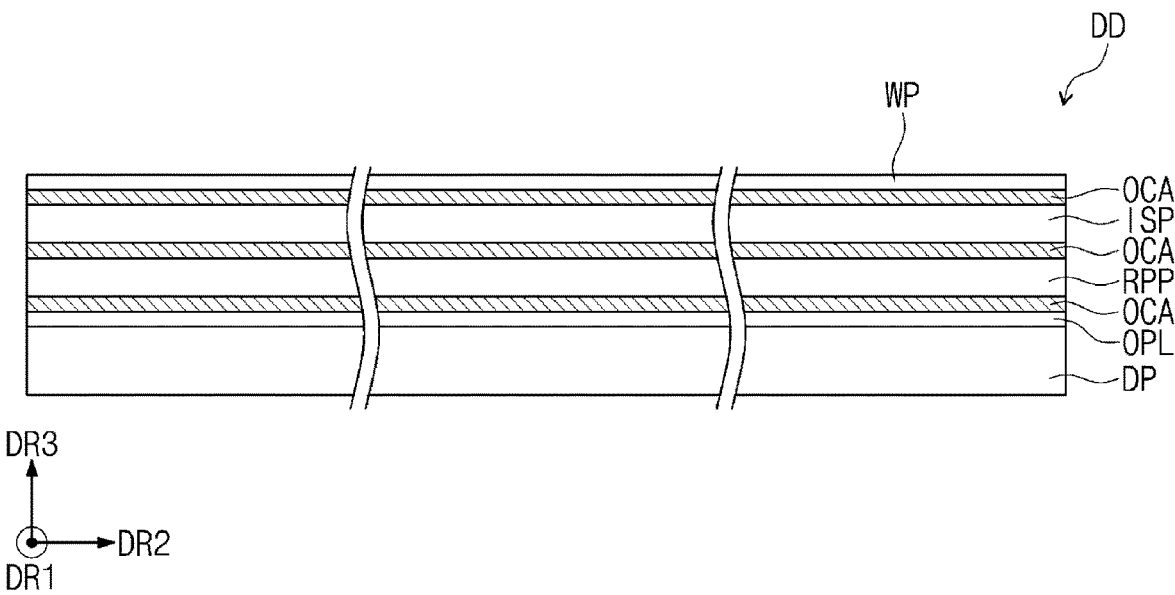
Figure 2D:
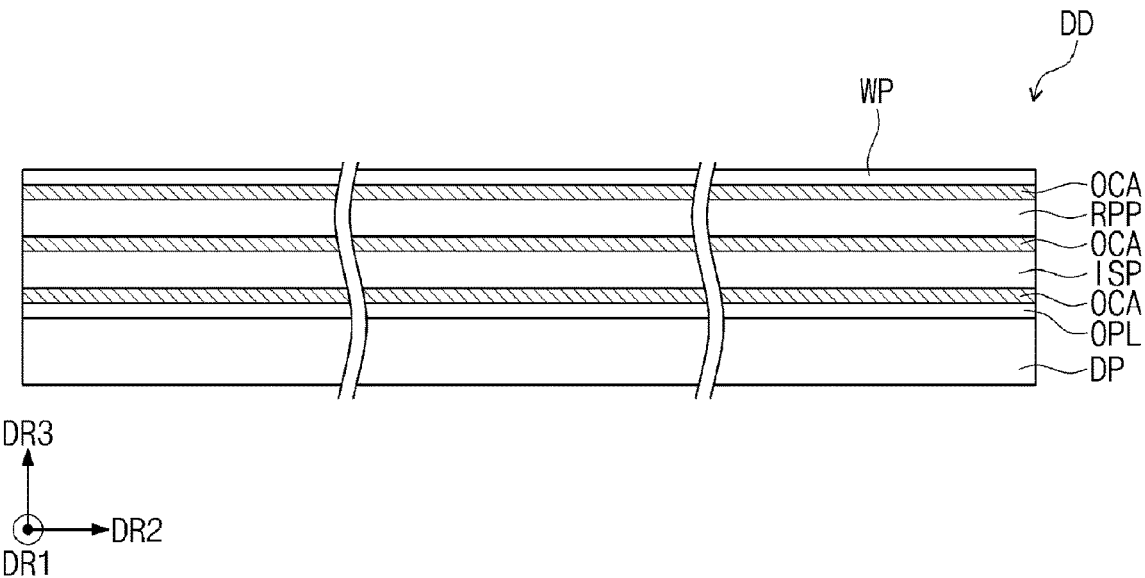
Figure 2E:
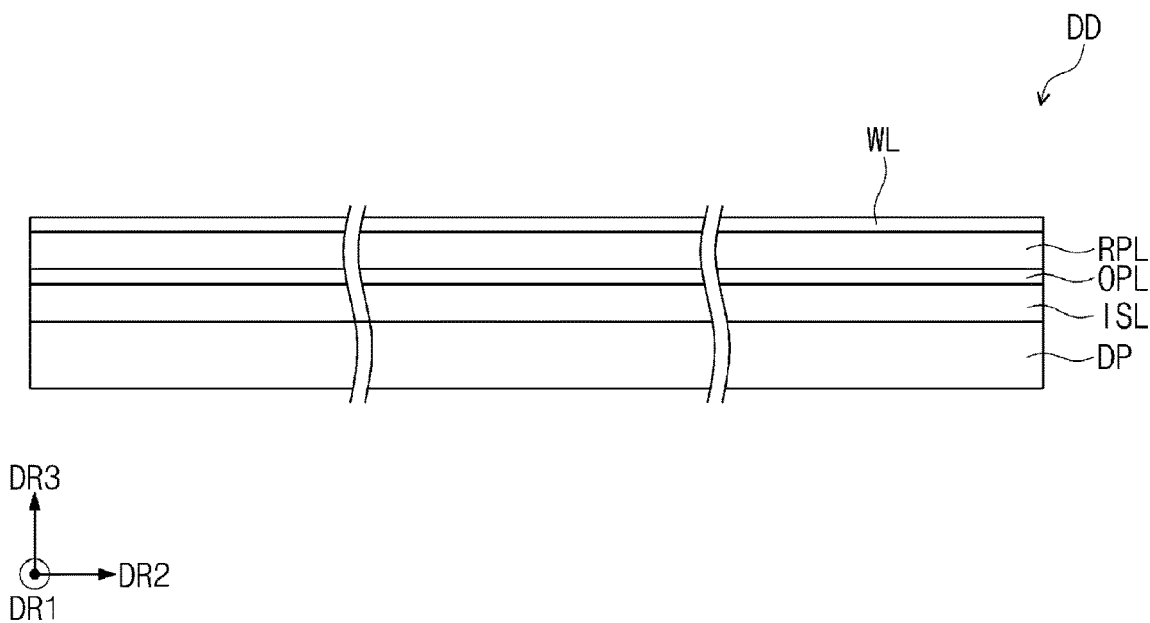

In FIG. 2C to FIG. 2E, the window panel WP and the window layer WL are illustrated without the distinction of the base layer WP-BS and the light-blocking pattern WP-BZ.

As illustrated in FIG. 2C to FIG. 2D, the display device DD may include the display panel DP, the optical layer OPL, the input sensing panel ISP, the anti-reflection panel RPP, and the window panel WP. The lamination order of the input sensing panel ISP and the anti-reflection panel RPP is not limited to the embodiments shown in the drawings, but may be changed.

As illustrated in FIG. 2E, the display device DD may include the display panel DP, the input sensing layer ISL, the optical layer OPL, the anti-reflection panel RPP, and the window layer WL. Compared to the display device DD illustrated in FIG. 2B, the optically transparent adhesive members OCA may be omitted, and the input sensing layer ISL, the optical layer OPL, the anti-reflection layer RPL, and the window layer WL may be formed through a continuous process. The lamination order of the input sensing layer ISL and the anti-reflection layer RPL is not limited to the embodiments shown in the drawings, but may be changed.

Figure 3:
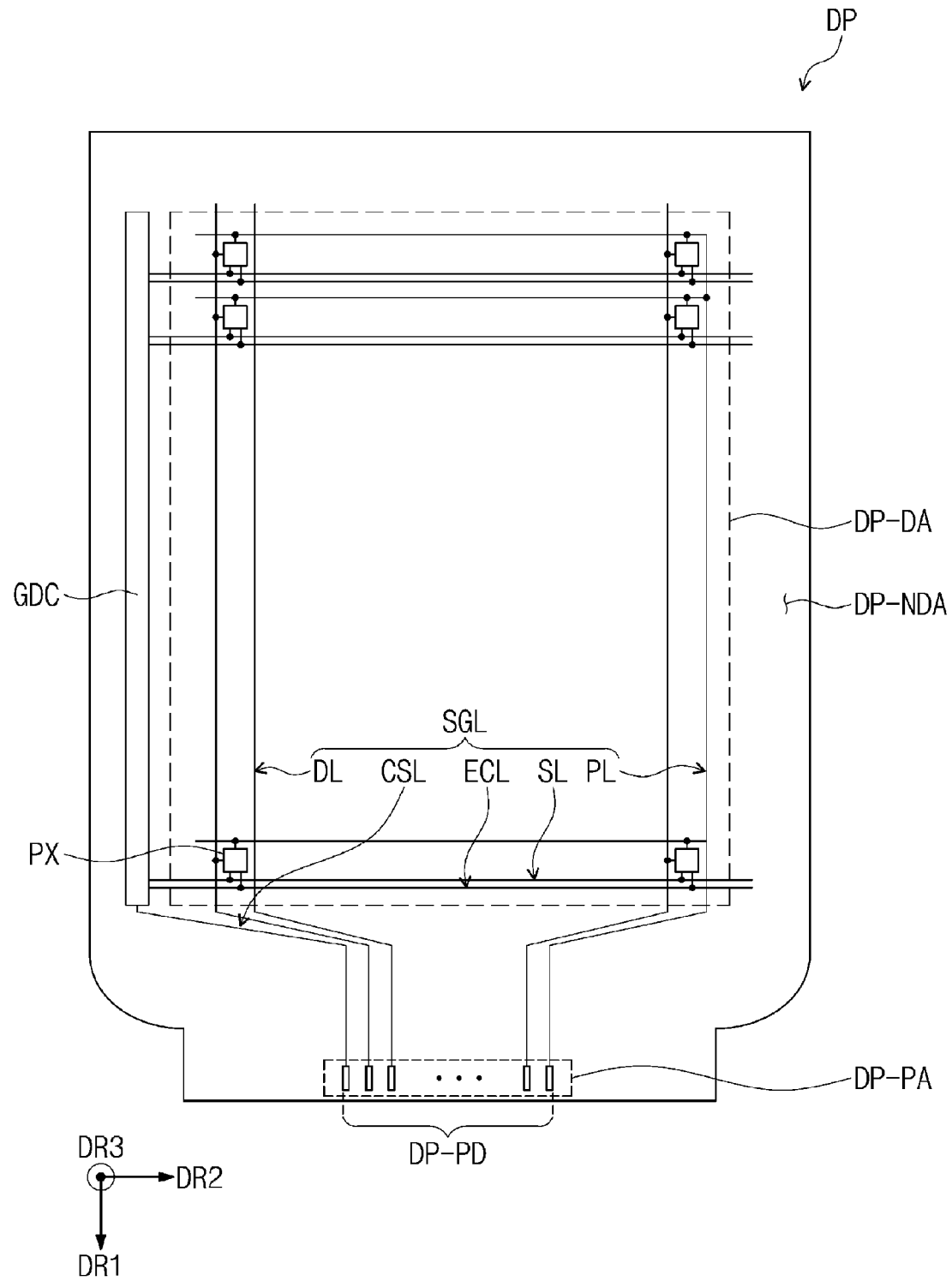
FIG. 3 is a plan view of a display panel according to an embodiment.

FIG. 3 is a plan view of a display panel according to an embodiment.

Referring to FIG. 3, the display panel DP may include a driving circuit GDC, a signal lines SGL (hereinafter, signal lines), signal pads DP-PD (hereinafter, signal pads), and pixels PX (hereinafter, pixels).

A display region DP-DA of the display panel DP may be defined as a region on which the pixels PX are disposed. The display region DP-DA of the display panel DP may be a region corresponding to the display region DA (see FIG. 1) of the display device DD (see FIG. 1), and a non-display region DP-NDA of the display panel DP may be a region corresponding to the non-display region NDA (see FIG. 1) of the display device DD (see FIG. 1).

The driving circuit GDC may include a scan driving circuit. The scan driving circuit generates scan signals, and may sequentially output the scan signals to scan lines SL.

The scan driving circuit may include thin film transistors formed through the same process as that of a driving circuit of the pixels PX, for example, a Low Temperature Polycrystalline Silicon (LTPS) process or a Low Temperature Polycrystalline Oxide (LTPO) process.

The signal lines SGL may include the scan lines SL, data lines DL, a power line PL, light emitting control lines ECL, and a control signal line CSL.

Each of the scan lines SL is connected to a corresponding one of the pixels PX. Each of the data lines DL is connected to a corresponding one of the pixels PX. The power line PL is connected to the pixels PX. Each of the light emitting control lines ECL is connected to a corresponding one of the pixels PX. The control signal line CSL may provide control signals to the scan driving circuit. Although the power line PL is described as singular in this embodiment, it may be plural in other embodiments.

The signal lines SGL may overlap the display region DP-DA and the non-display region DP-NDA. The signal lines SGL may include a pad unit and a line unit. The line unit may overlap the display region DP-DA and the non-display region DP-NDA. The pad unit may be disposed at an end of the line unit. The pad unit may be disposed in the non-display region DP-NDA, and may overlap a corresponding signal pad among the signal pads DP-PD. In the non-display region DP-NDA, a region in which the signal pads DP-PD are disposed may be defined as a pad region DP-PA. A circuit board (not shown) may be connected to the pad region DP-PA.

Figure 4:
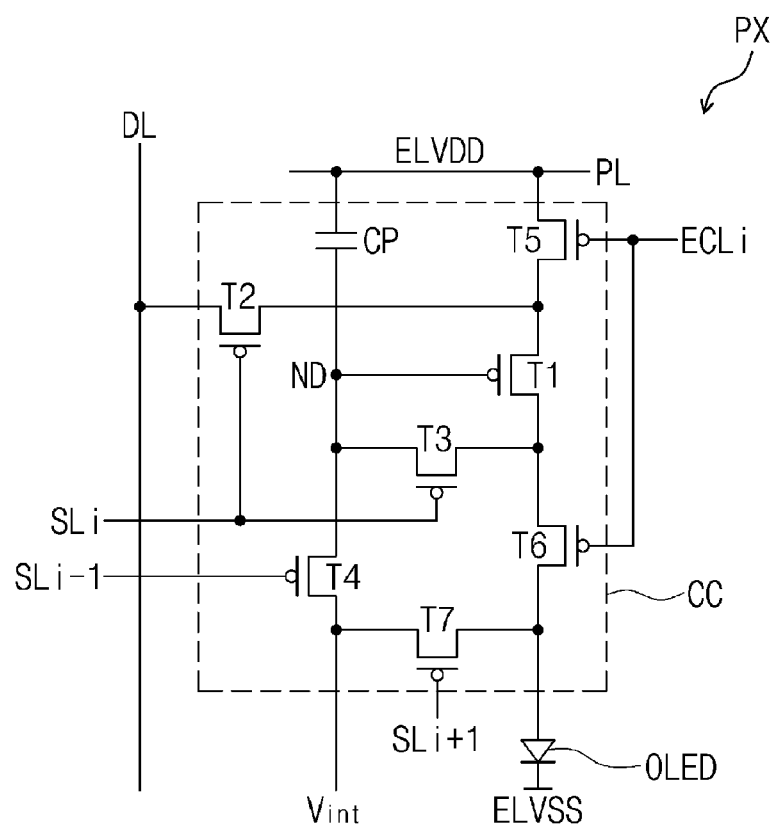
FIG. 4 is schematic diagram of an equivalent circuit of a pixel PX according to an embodiment.

FIG. 4 is schematic diagram of an equivalent circuit of a pixel PX according to an embodiment. FIG. 4 illustrates the pixel PX connected to an $i^{th}$ scan line SLi and an $i^{th}$ light emission control line ECLi.

The pixel PX may include an organic light emitting diode OLED and a pixel circuit CC. The pixel circuit CC may include transistors T1 to T7 and a capacitor CP. The pixel circuit CC may control the amount of current flowing through the organic light emitting diode OLED in accordance with a data signal.

The organic light emitting diode OLED may emit light of a predetermined luminance in accordance with the amount of current provided from the pixel circuit CC. To this end, the level of a first power ELVDD may be set to be higher than the level of a second power ELVSS.

Each of the transistors T1 to T7 may include an input electrode (or a source electrode), an output electrode (or a drain electrode), and a control electrode (or a gate electrode).

A first electrode of a first transistor T1 may be connected to the power line PL via a fifth transistor T5. The power line PL may provide the first power ELVDD to the first electrode of the first transistor T1 via the fifth transistor T5. A second electrode of the first transistor T1 may be connected to an anode electrode of the organic light emitting diode OLED via a sixth transistor T6.

The first transistor T1 may control the amount of current flowing through the organic light emitting diode OLED in accordance with a voltage applied to a control electrode of the first transistor T1.

A second transistor T2 may be connected between the data line DL and the first electrode of the first transistor T1. A control electrode of the second transistor T2 may be connected to an $i^{th}$ scan line SLi. The second transistor T2 may be turned on when an $i^{th}$ scan signal is provided to the $i^{th}$ scan line SLi to electrically connect the data line DL and the first electrode of the first transistor T1.

A third transistor T3 may be connected between the second electrode of the first transistor T1 and the control electrode of the first transistor T1. A control electrode of the third transistor T3 may be connected to the $i^{th}$ scan line SLi. The third transistor T3 may be turned on when the $i^{th}$ scan signal is provided to the $i^{th}$ scan line SLi to electrically connect the second electrode of the first transistor T1 and the control electrode of the first transistor T1. Accordingly, when the third transistor T3 is turned on, the first transistor T1 may be connected in the form of a diode.

A fourth transistor T4 may be connected between a node ND and an initialization power generating unit (not shown). A control electrode of the fourth transistor T4 may be connected to an $i-1^{st}$ scan line SLi−1. The fourth transistor T4 may be turned on when an $i-1^{st}$ scan signal is provided to the $i-1^{st}$ scan line SLi−1 to provide an initialization voltage Vint to the node ND.

A fifth transistor T5 may be connected between the power line PL and the first electrode of the first transistor T1. A control electrode of the fifth transistor T5 may be connected to an $i^{th}$ light emission control line ECLi.

A sixth transistor T6 may be connected between the second electrode of the first transistor T1 and the anode electrode of the organic light emitting diode OLED. A control electrode of the sixth transistor T6 may be connected to the $i^{th}$ light emission control line ECLi.

A seventh transistor T7 may be connected between the initialization power generating unit (not shown) and the anode electrode of the organic light emitting diode OLED. A control electrode of the seventh transistor T7 may be connected to an $i+1^{st}$ scan line SLi+1. The seventh transistor T7 may be turned on when an $i+1^{st}$ scan signal is provided to the $i+1^{st}$ scan line SLi+1 to provide the initialization voltage Vint to the anode electrode of the organic light emitting diode OLED.

The seventh transistor T7 may improve the capability of the black expression or display by the pixel PX. For example, when the seventh transistor T7 is turned on, a parasitic capacitor (not shown) of the organic light emitting diode OLED is discharged. Then, when black luminance is implemented or the pixel PX displays black, the organic light emitting diode OLED does not emit light due to leakage current from the first transistor T1, and accordingly, the capability of expressing or displaying black may be improved.

Additionally, FIG. 4 illustrates the control electrode of the seventh transistor T7 being connected to the $i+1^{st}$ scan line SLi+1, but the disclosure is not limited thereto. In other embodiments, the control electrode of the seventh transistor T7 may be connected to the $i^{th}$ scan line SLi or the $i-1^{st}$ scan line SLi−1.

Although FIG. 4 illustrates PMOS transistors by way of example, the embodiment is not limited thereto. In another embodiment, the pixel circuit CC may include NMOS transistors. In another embodiment, the pixel circuit CC may be formed of a combination of NMOS and PMOS transistors.

The capacitor CP may be disposed between the power line PL and the node ND. The capacitor CP may store a voltage corresponding to a data signal. When the fifth transistor T5 and the sixth transistor T6 are turned on in accordance with the voltage stored in the capacitor CP, the amount of current flowing through the first transistor T1 may be determined. In the disclosure, an equivalent circuit of the pixel PX is not limited to the equivalent circuit illustrated in FIG. 4.

Figure 5:
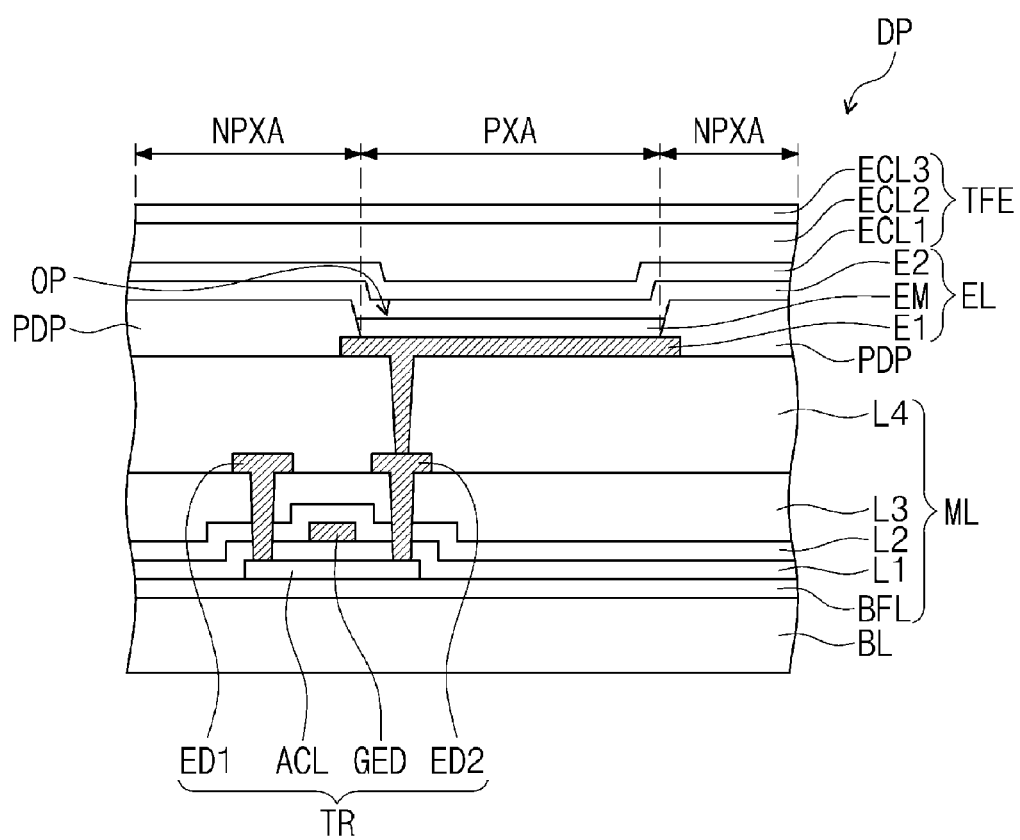
FIG. 5 is a schematic cross-sectional view illustrating a portion of the configuration of a display panel according to an embodiment.

FIG. 5 is a schematic cross-sectional view illustrating a portion of the configuration of a display panel according to an embodiment.

Referring to FIG. 5, the display panel DP may include a base layer BL, a circuit layer ML, a pixel definition film PDP, a light emitting element layer EL, and an encapsulation layer TFE.

The base layer BL may include a synthetic resin film. A synthetic resin layer may be formed on a work substrate used in manufacturing the display panel DP. Thereafter, a conductive layer, an insulation layer, and the like may be formed on the synthetic resin layer. After the work substrate is removed, the synthetic resin layer may correspond to the base layer BL. The synthetic resin layer may include a thermosetting resin. For example, the synthetic resin layer may be a polyimide-based resin layer, but the material thereof is not limited thereto. The base layer BL may include an organic/inorganic composite material substrate and the like.

The circuit layer ML may include the driving circuit GDC, the signal lines SGL, and the signal pads DP-PD of FIG. 3. FIG. 5 illustrates some of the components of the circuit layer ML. The circuit layer ML may include a transistor TR and insulation layers BFL, L1, L2, L3, and L4.

An insulation layer BFL is disposed on the base layer BL, and the transistor TR may be disposed on the insulation layer BFL. The transistor TR of FIG. 5 may be the first transistor T1 illustrated in FIG. 4. The transistor TR may include a semiconductor layer ACL, a control electrode GED, a first electrode ED1 and a second electrode ED2.

The semiconductor layer ACL may be disposed on the insulation layer BFL. The insulation layer BFL may be a barrier layer for protecting a lower surface of the semiconductor layer ACL. The insulation layer BFL may block contaminants or moisture in the base layer BL from penetrating into the semiconductor layer ACL or contaminants or moisture in the outside from penetrating into the semiconductor layer ACL through the base layer BL. In an embodiment, the insulation layer BFL may be selectively disposed or omitted.

The semiconductor layer ACL includes a semiconductor material. The semiconductor material may be selected from amorphous silicon, polysilicon, a metal oxide semiconductor, and a combination thereof.

A first insulation layer L1 may be disposed on the insulation layer BFL, and may cover the semiconductor layer ACL. The first insulation layer L1 may include an organic material or an inorganic material.

The control electrode GED may be disposed on the first insulation layer L1. A second insulation layer L2 may be disposed on the first insulation layer L1, and may cover the control electrode GED. The second insulation layer L2 may include an inorganic material. In an embodiment, the second insulation layer L2 may be omitted.

A third insulation layer L3 may be disposed on the second insulation layer L2. The first electrode ED1 and the second electrode ED2 may be disposed on the third insulation layer L3. The first electrode ED1 and the second electrode ED2 may be connected to the semiconductor layer ACL through through-holes passing through the first insulation layer L1, the second insulation layer L2, and the third insulation layer L3.

A fourth insulation layer L4 may be disposed on the third insulation layer L3, and may cover the first electrode ED1 and the second electrode ED2. The fourth insulation layer L4 may be formed of a single layer or multiple layers. For example, the single layer may include an organic layer. The multiple layers may be provided by laminating an organic layer and an inorganic layer. The fourth insulation layer L4 may be a planarization layer for providing a flat surface on an upper portion thereof.

The pixel definition film PDP and the light emitting element layer EL may be disposed on the fourth insulation layer L4.

The pixel definition film PDP may be disposed on the circuit layer ML. An opening OP may be defined in the pixel definition film PDP. A light emitting region PXA may be defined in a region in which light is generated in the organic light emitting diode OLED (see FIG. 3). In the embodiment, the light emitting region PXA may be defined in a region corresponding to the opening OP. The opening OP may expose at least a portion of a first electrode E1. The display panel DP may include a non-light emitting region NPXA in which light is not generated. The non-light emitting region NPXA may be a region which is not the light emitting region PXA.

The light emitting element layer EL may include the first electrode E1, a light emitting layer EM, and a second electrode E2. The light emitting element layer EL may correspond to the organic light emitting diode OLED described with reference to FIG. 4.

The first electrode E1 may be disposed on the fourth insulation layer L4, and may be electrically connected to the second electrode ED2 through a through-hole defined in the fourth insulation layer L4. The first electrode E1 may correspond to the anode electrode of the organic light emitting diode OLED described with reference to FIG. 4.

The light emitting layer EM may be disposed between the first electrode E1 and the second electrode E2. The light emitting layer EM may have a single-layered structure having a single layer formed of a single material, or a multi-layered structure having layers formed of different materials.

The light emitting layer EM may include an organic material. The organic material is not particularly limited as long as it is a material in the relevant art. For example, the light emitting layer EM may be formed of at least one of materials emitting red, green, and blue colors, and may include a fluorescent material or a phosphorescent material.

The second electrode E2 may be disposed on the light emitting layer EM and the pixel definition film PDP. The second electrode E2 may receive the second power ELVSS (see FIG. 4).

The encapsulation layer TFE may be disposed on the second electrode E2. Although not illustrated, a capping layer for covering the second electrode E2 may be disposed between the encapsulation layer TFE and the second electrode E2. The encapsulation layer TFE may directly cover the capping layer.

The encapsulation layer TFE may include a first inorganic layer ECL1, an organic layer ECL2, and a second inorganic layer ECL3 sequentially laminated. The organic layer ECL2 may be disposed between the first inorganic layer ECL1 and the second inorganic layer ECL3. The first inorganic layer ECL1 and the second inorganic layer ECL3 may be formed by depositing an inorganic material, and the organic layer ECL2 may be formed by depositing, printing, or coating an organic material.

The first inorganic layer ECL1 and the second inorganic layer ECL3 may include at least one of silicon nitride, silicon oxy nitride, silicon oxide, titanium oxide, and aluminum oxide. The organic layer ECL2 may include a polymer, for example, an acrylic organic layer. However, this is only an example, and the embodiment is not limited thereto.

FIG. 5 illustrates the encapsulation layer TFE including two inorganic layers and one organic layer, but the embodiment is not limited thereto. For example, the encapsulation layer TFE may include three inorganic layers and two organic layers. For example, the encapsulation layer TFE may have a structure in which the inorganic layers and the organic layers are alternately laminated.

Figure 6:
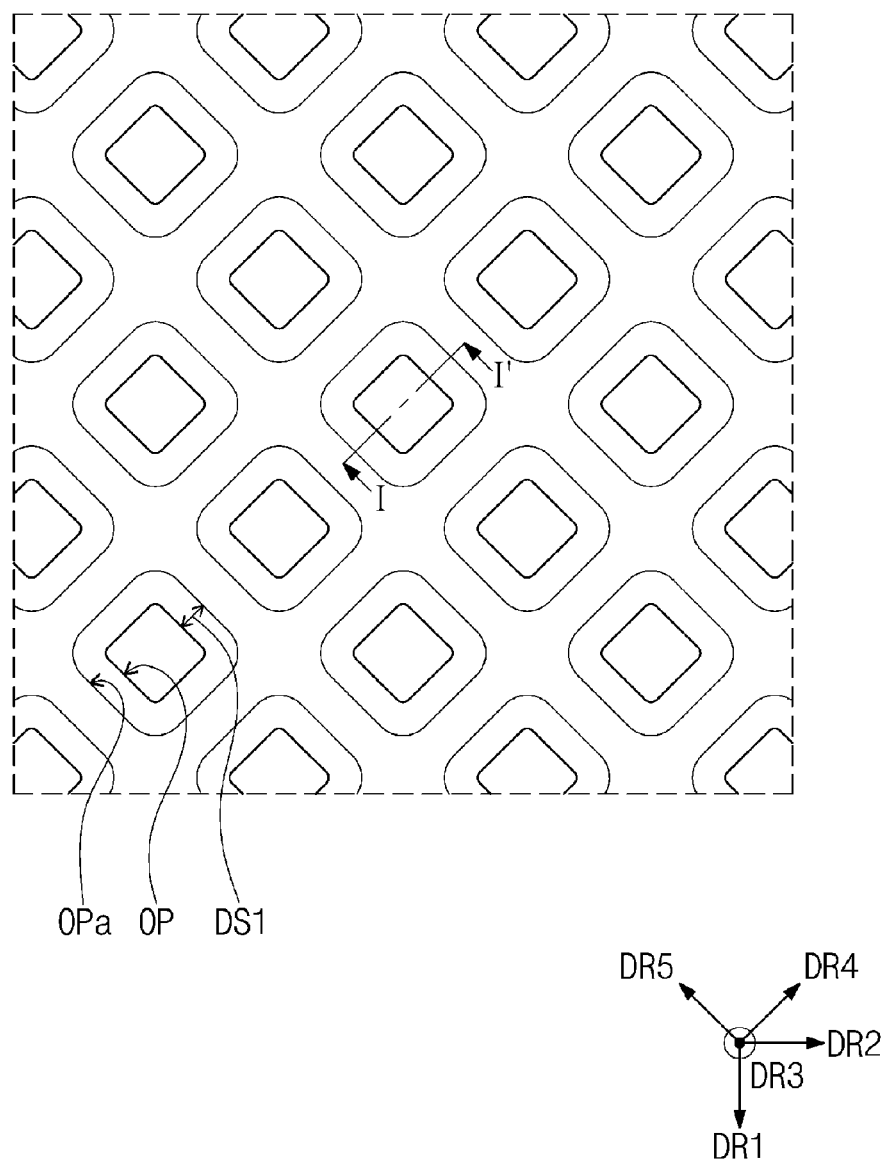
FIG. 6 is a plan view illustrating a portion of a display panel and a portion of an optical layer according to an embodiment.
Figure 7:
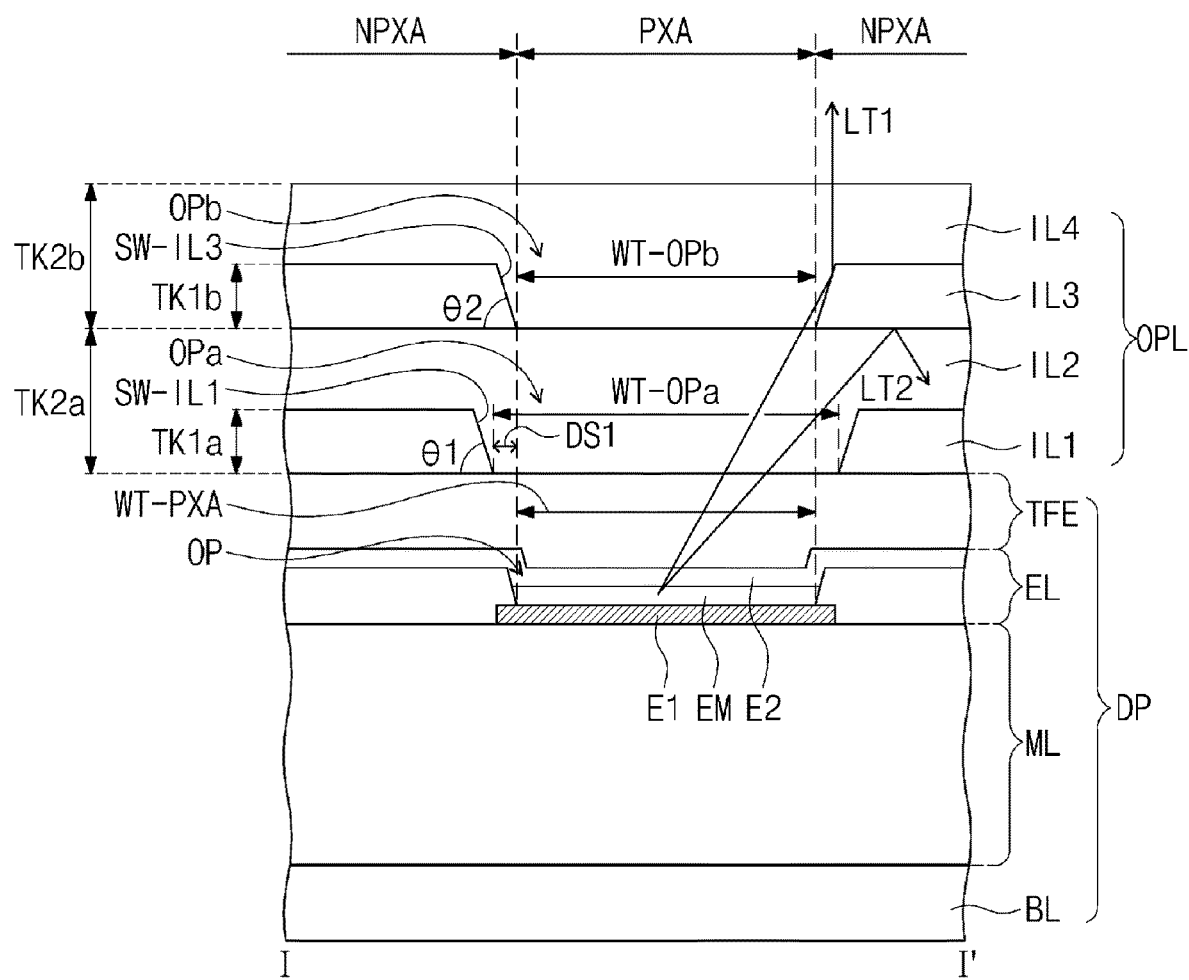
FIG. 7 is a schematic cross-sectional view taken along line I-I' of FIG. 6.
Figure 7:
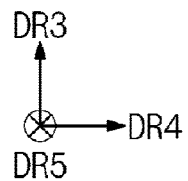

FIG. 6 is a plan view illustrating a portion of a display panel and a portion of an optical layer according to an embodiment, and FIG. 7 is a schematic cross-sectional view taken along line I-I' of FIG. 6.

Referring to FIG. 6 and FIG. 7, the multiple light emitting regions PXA may be provided. The light emitting regions PXA may be arranged along a fourth direction DR4. The fourth direction DR4 may be a direction intersecting the first direction DR1 and the second direction DR2. The light emitting regions PXA may be arranged along a fifth direction DR5 intersecting the fourth direction DR4. FIG. 6 illustrates each of the light emitting regions PXA having the same area. However, the embodiment is not limited thereto. Each of the light emitting regions PXA according to an embodiment may have different areas.

The optical layer OPL may be disposed on the display panel DP. The optical layer OPL may include a first insulation layer IL1, a second insulation layer IL2, a third insulation layer IL3, and a fourth insulation layer IL4.

The first insulation layer IL1 may be disposed on the display panel DP. The first insulation layer IL1 may include a first organic matter. The first organic matter may include an acrylic resin. However, this is only an example. The first organic matter is not limited to the above example.

The first insulation layer IL1 may have first openings defined in a region overlapping the light emitting regions PXA. The first insulation layer IL1 may have a mesh shape on a plan view. FIG. 7 illustrates one first opening OPa and a light emitting region PXA corresponding to the first opening OPa among the light emitting regions PXA.

The first insulation layer IL1 may have a first refractive index. The first refractive index may be in a range of about 1.45 to about 1.55. The first insulation layer IL1 may have a thickness TK1$a$ in a range of about 1.5 μm to about 5 μm.

The first insulation layer IL1 may include a first through-surface SW-IL1 defining the first opening OPa. A minimum angle θ1 between the first through-surface SW-IL1 and a surface on which the first insulation layer IL1 is disposed may be in a range of about 60° to about 80°. The surface on which the first insulation layer IL1 is disposed may be an upper surface of the display panel DP.

The absolute value of the difference DS1 between the width WT-OPa of the first opening OPa and the width WT-PXA of the light emitting region PXA may be about 3 μm or less.

The second insulation layer IL2 may cover the display panel DP and the first insulation layer IL1. The second insulation layer IL2 may include a second organic matter different from the first organic matter. The second organic matter may include zirconia. However, this is only an example. The second organic matter is not limited to the above example. The second insulation layer IL2 may have a second refractive index. The second refractive index may be greater than the first refractive index. The second refractive index may be in a range of about 1.65 to about 1.80. The second insulation layer IL2 may have a maximum thickness TK2a greater than the thickness TK1a of the first insulation layer IL1. The maximum thickness TK2a of the second insulation layer IL2 may be in a range of about 3 μm to about 20 μm. The second insulation layer IL2 may overlap the first opening OPa on a plane. The second insulation layer IL2 may be filled in the first opening OPa. The second insulation layer IL2 may provide a flat surface on an upper portion thereof.

The third insulation layer IL3 may be disposed on the second insulation layer IL2. The third insulation layer IL3 and the first insulation layer IL1 may include the same material. The third insulation layer IL3 may have second openings defined in a region overlapping the light emitting regions PXA. In the embodiment, the third insulation layer IL3 and the first insulation layer IL1 may have the same shape on a plane. For example, on a plane, the third insulation layer IL3 may have a mesh shape. FIG. 7 illustrates one second opening OPb and one light emitting region PXA corresponding the second opening OPb among the light emitting regions PXA. The second opening OPb may overlap the first opening OPa on a plane.

The third insulation layer IL3 may have the first refractive index. The third insulation layer IL3 may have a thickness TK1b in a range of about 1.5 μm to about 5 μm. The third insulation layer IL3 may include a second through-surface SW-IL3 defining the second opening OPb. A minimum angle θ2 between the second through-surface SW-IL3 and a surface on which the third insulation layer IL3 is disposed may be in a range of about 60° to about 80°. The surface on which the third insulation layer IL3 may be disposed may be an upper surface of the second insulation layer IL2.

The absolute value of the difference between the width WT-OPb of the second opening OPb and the width WT-PXA of the light emitting region PXA may be about 3 μm or less. FIG. 7 illustrates a case in which the difference between the width WT-OPb of the second opening OPb and the width WT-PXA of the light emitting region PXA is about zero.

The fourth insulation layer IL4 may cover the second insulation layer IL2 and the third insulation layer IL3. The fourth insulation layer IL4 may include the second organic matter. The fourth insulation layer IL4 may have the second refractive index. The fourth insulation layer IL4 may have a maximum thickness TK2b greater than the thickness TK1b of the third insulation layer IL3. The maximum thickness TK2b of the fourth insulation layer IL4 may be in a range of about 3 μm to about 20 μm. The fourth insulation layer IL4 may overlap each of the first opening OPa and the second opening OPb on a plane. The fourth insulation layer IL4 may be filled in the second opening OPb. The fourth insulation layer IL4 may provide a flat surface on an upper portion thereof.

For ease of explanation, FIG. 7 illustrates a first light LT1 and a separate second light LT2 according to the path of light generated in the light emitting layer EM. The first light LT1 and the second light LT2 may be emitted in the lateral direction. The first light LT1 may be provided to the third insulation layer IL3 from the light emitting layer EM. The first light LT1 may be refracted or reflected in the third direction DR3 from the second through-surface SW-IL3 due to the refractive index difference between the third insulation layer IL3 and the fourth insulation layer IL4 and the minimum angle θ2 between the second through-surface SW-IL3 and the surface on which the third insulation layer IL3 is disposed. When the minimum angle θ2 between the second through-surface SW-IL3 and the surface on which the third insulation layer IL3 is disposed is less than about 60° or greater than about 80°, the first light LT1 may not be refracted or reflected in the third direction DR3. However, this is only an example. In an embodiment, the first light LT1 may be provided to the first insulation layer IL1 from the light emitting layer EM. The first light LT1 may be refracted or reflected in the third direction DR3 from the first through-surface SW-IL1 due to the refractive index difference between the first insulation layer IL1 and the second insulation layer IL2 and the minimum angle θ1 between the first through-surface SW-IL1 and the surface on which the first insulation layer IL1 is disposed. When the minimum angle θ1 between the first through-surface SW-IL1 and the surface on which the first insulation layer IL1 is disposed is less than about 60° or greater than about 80°, the first light LT1 may not be refracted or reflected in the third direction DR3. The second light LT2 may be light having an incident path toward a lower surface of the third insulation layer IL3. The second light LT2 may be reflected from the lower surface of the third insulation layer IL3 due to the refractive index difference between the second insulation layer IL2 and the third insulation layer IL3. Accordingly, the second light LT2 may not be visible from the outside.

According to the disclosure, light emitted from the light emitting layer EM of the display device DD (see FIG. 1) may be refracted or reflected due to the refractive index difference between the first insulation layer IL1 and the second insulation layer IL2, between the second insulation layer IL2 and the third insulation layer IL3, and between the third insulation layer IL3 and the fourth insulation layer IL4, so that a light path may be changed. For example, the light path may be changed in the third direction DR3 or in a direction close to the third direction DR3, or in a direction in which the light is not visible. Due to the changed light path, the light emitting efficiency of the display device DD (see FIG. 1) may be improved and the straightness of the light in a front direction may be improved. Accordingly, the disclosure may provide a display device DD (see FIG. 1) having improved light efficiency.

Figure 8:
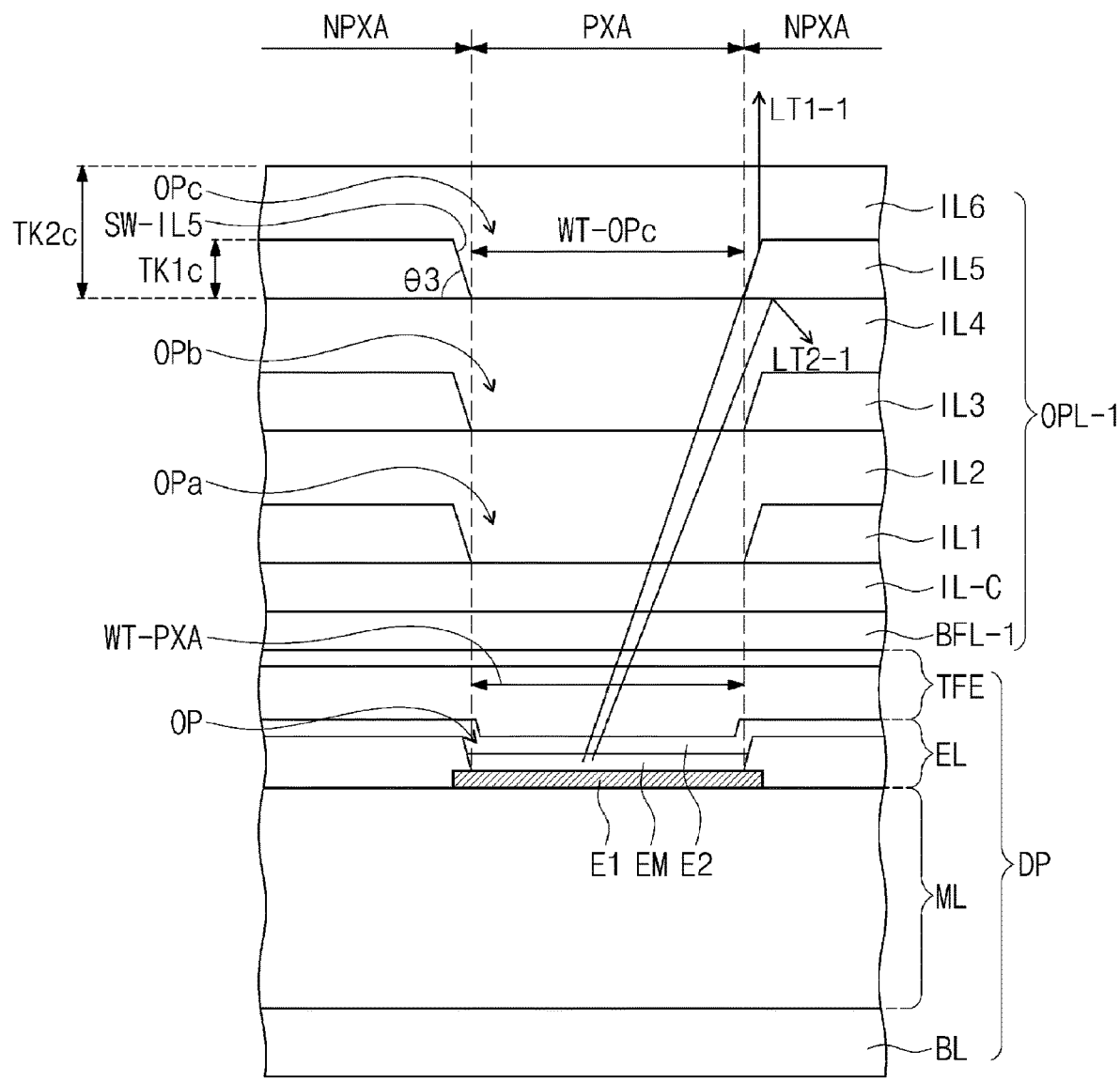
FIG. 8 is a schematic cross-section of a region corresponding to the region taken along line I-I' of FIG. 6.

FIG. 8 is a schematic cross-section of a region corresponding to the region taken along line I-I' of FIG. 6. The same reference numerals are given to the elements described with reference to FIG. 6 and FIG. 7, and the descriptions thereof are omitted.

Referring to FIG. 8, an optical layer OPL-1 may be disposed on the display panel DP. The optical layer OPL-1 may include a buffer layer BFL-1, an interlayer insulation layer IL-C, the first insulation layer IL1, the second insulation layer IL2, the third insulation layer IL3, the fourth insulation layer IL4, a fifth insulation layer IL5, and a sixth insulation layer IL6.

The buffer layer BFL-1 may be disposed on the encapsulation layer TFE. The buffer layer BFL-1 may include an inorganic matter. For example, the inorganic matter may be silicon nitride. However, this is only an example. In an embodiment, the buffer layer BFL-1 may be omitted.

The interlayer insulation layer IL-C may be disposed on the buffer layer BFL-1. The interlayer insulation layer IL-C may include an inorganic matter. For example, the inorganic matter may be silicon nitride. However, this is only an example. In an embodiment, the interlayer insulation layer IL-C may be omitted.

The fifth insulation layer IL5 may be disposed on the fourth insulation layer IL4. The fifth insulation layer IL5 and the first insulation layer IL1 may include the same material. The fifth insulation layer IL5 may have third openings defined in a region overlapping the light emitting regions PXA. The fifth insulation layer IL5 may have a mesh shape on a plan view. FIG. 8 illustrates one third opening OPc and one light emitting region PXA corresponding to the third opening OPc among the light emitting regions PXA.

The fifth insulation layer IL5 may have a refractive index in a range of about 1.45 to about 1.55. The fifth insulation layer IL5 may have a thickness TK1c in a range of about 1.5 μm to about 5 μm. The fifth insulation layer IL5 may include a third through-surface SW-IL5 defining the third opening OPc. A minimum angle θ3 between the third through-surface SW-IL5 and a surface on which the fifth insulation layer IL5 is disposed may be in a range of about 60° to about 80°. The surface on which the fifth insulation layer IL5 may be disposed may be an upper surface of the fourth insulation layer IL4.

The absolute value of the difference between the width WT-OPc of the third opening OPc and the width WT-PXA of the light emitting region PXA may be about 3 μm or less. FIG. 8 illustrates a case in which the difference between the width WT-OPc of the third opening OPc and the width WT-PXA of the light emitting region PXA is about zero.

The sixth insulation layer IL6 may cover the fourth insulation layer IL4 and the fifth insulation layer IL5. The sixth insulation layer IL6 may have a refractive index greater than the refractive index of the fifth insulation layer IL5. The sixth insulation layer IL6 may have a refractive index in a range of about 1.65 to about 1.80. The sixth insulation layer IL6 may have a maximum thickness TK2c greater than the thickness TK1c of the fifth insulation layer IL5. The maximum thickness TK2c of the sixth insulation layer IL6 may be in a range of about 3 μm to about 20 μm. The sixth insulation layer IL6 may overlap each of the first opening OPa, the second opening OPb, and the third opening OPc on a plane. The sixth insulation layer IL6 may be filled in the third opening OPc. The sixth insulation layer IL6 may provide a flat surface on an upper portion thereof.

For ease of explanation, FIG. 8 illustrates a first light LT1-1 and a separate second light LT2-1 according to the path of light generated in the light emitting layer EM. The first light LT1-1 and the second light LT2-1 may be emitted in the lateral direction. The first light LT1-1 may be provided to the fifth insulation layer IL5 from the light emitting layer EM. The first light LT1-1 may be refracted or reflected in the third direction DR3 from the third through-surface SW-IL5 due to the refractive index difference between the fifth insulation layer IL5 and the sixth insulation layer IL6 and the minimum angle θ3 between the third through-surface SW-IL5 and the surface on which the fifth insulation layer IL5 is disposed. When the minimum angle θ3 between the third through-surface SW-IL5 and the surface on which the fifth insulation layer IL5 is disposed is less than about 60° or greater than about 80°, the first light LT1-1 may not be refracted or reflected in the third direction DR3.

The second light LT2-1 may be light having an incident path toward a lower surface of the fifth insulation layer IL5. The second light LT2-1 may be reflected from the lower surface of the fifth insulation layer IL5 due to the refractive index difference between the fourth insulation layer IL4 and the fifth insulation layer IL5. Accordingly, the second light LT2-1 may not be visible from the outside.

In other embodiments, light emitted from the light emitting layer EM of the display device DD (see FIG. 1) may be refracted or reflected due to the refractive index difference between the fourth insulation layer IL4 and the fifth insulation layer IL5 and the refractive index difference between the fifth insulation layer IL5 and the sixth insulation layer IL6, so that a light path may be changed. The fifth insulation layer IL5 and the sixth insulation layer IL6 may refract or reflect light from the fifth insulation layer IL5 such that the light not refracted or reflected from the first insulation layer IL1 and the third insulation layer IL3 may be refracted or reflected from the fifth insulation layer IL5. For example, the light path may be changed in the third direction DR3 or in a direction close to the third direction DR3, or in a direction in which the light is not visible. Due to the changed light path, the light emitting efficiency of the display device DD (see FIG. 1) may be improved and the straightness of the light in a front direction may be improved. Accordingly, the light efficiency may be improved in the display device DD (see FIG. 1).

Figure 9:
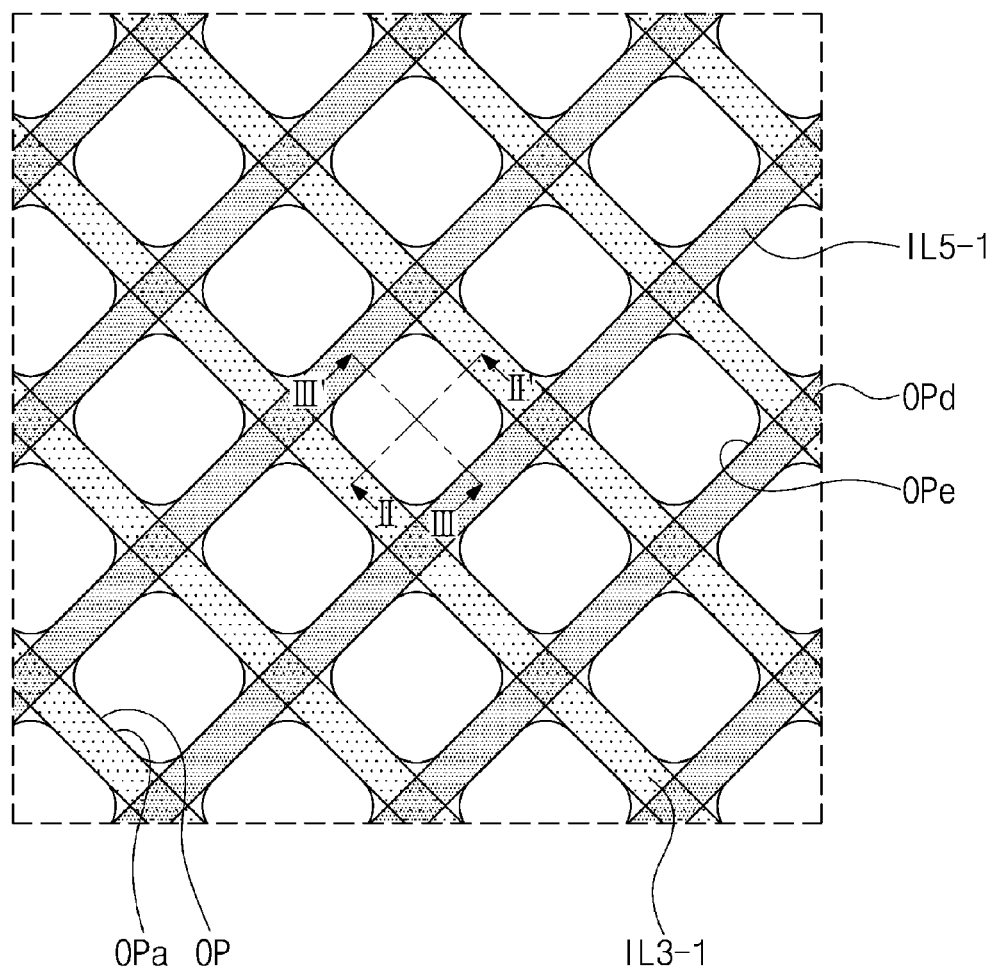
FIG. 9 is a plan view illustrating a portion of a display panel and a portion of an optical layer both according to an embodiment.
Figure 9:
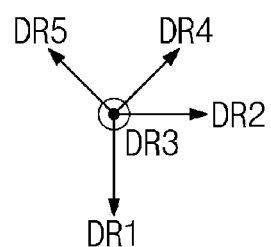
Figure 10:
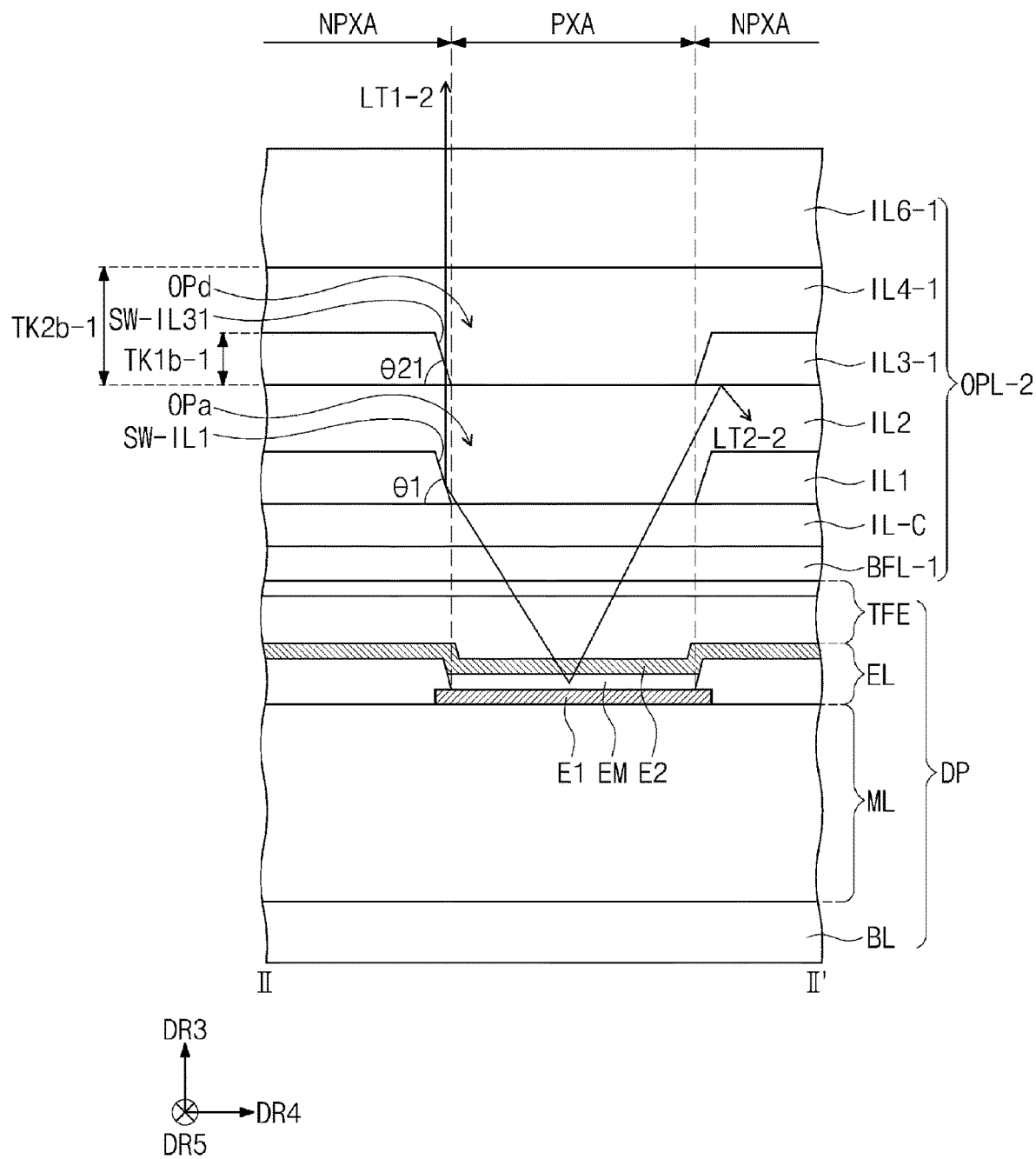
FIG. 10 is a schematic cross-sectional view taken along line II-II' of FIG. 9.

FIG. 9 is a plan view illustrating a portion of a display panel and a portion of an optical layer according to an embodiment, and FIG. 10 is a schematic cross-sectional view taken along line II-II' of FIG. 9. The same reference numerals are given to the elements described with reference to FIG. 6 to FIG. 8, and the descriptions thereof are omitted.

Referring to FIG. 9 and FIG. 10, an optical layer OPL-2 may be disposed on the display panel DP. The optical layer OPL-2 may include the buffer layer BFL-1, the interlayer insulation layer IL-C, the first insulation layer ILL the second insulation layer IL2, a third insulation layer IL3-1, a fourth insulation layer IL4-1, a fifth insulation layer IL5-1, and a sixth insulation layer IL6-1.

The third insulation layer IL3-1 may be disposed on the second insulation layer IL2. The third insulation layer IL3-1 and the first insulation layer IL1 may be formed of the same material. The third insulation layer IL3-1 may have second openings spaced apart in the fourth direction DR4 and extended in the fifth direction DR5 intersecting the fourth direction DR4 on a plane. The third insulation layer IL3-1 may have a stripe shape on a plan view. FIG. 10 illustrates one second opening OPd.

The third insulation layer IL3-1 may have a refractive index in a range of about 1.45 to about 1.55. The third insulation layer IL3-1 may have a thickness TK1b-1 in a range of about 1.5 μm to about 5 μm. The third insulation layer IL3-1 may include a second through-surface SW-IL31 defining the second opening OPd. A minimum angle θ21 between the second through-surface SW-IL31 and a surface on which the third insulation layer IL3-1 is disposed may be in a range of about 60° to about 80°. The surface on which the third insulation layer IL3-1 is disposed may be an upper surface of the second insulation layer IL2.

The fourth insulation layer IL4-1 may cover the second insulation layer IL2 and the third insulation layer IL3-1. The fourth insulation layer IL4-1 and the second insulation layer IL2 may be formed of the same material. The fourth insulation layer IL4-1 may have a refractive index greater than the refractive index of the third insulation layer IL3-1. The fourth insulation layer IL4-1 may have a refractive index in a range of about 1.65 to about 1.80. The fourth insulation layer IL4-1 may have a maximum thickness TK2b-1 greater than the thickness TK1b-1 of the third insulation layer IL3-1. The maximum thickness TK2b-1 of the fourth insulation layer IL4-1 may be in a range of about 3 µm to about 20 µm. The fourth insulation layer IL4-1 may overlap each of the first opening OPa and the second opening OPd on a plane. The fourth insulation layer IL4-1 may be filled in the second opening OPd. The fourth insulation layer IL4-1 may provide a flat surface on an upper portion thereof.

For ease of explanation, FIG. 10 illustrates a first light LT1-2 and a separate second light LT2-2 according to the path of light generated in the light emitting layer EM. The first light LT1-2 and the second light LT2-2 may be emitted in the lateral direction. The first light LT1-2 may be provided to the first insulation layer IL1 from the light emitting layer EM. The first light LT1-2 may be refracted or reflected in the third direction DR3 from the first through-surface SW-IL1 due to the refractive index difference between the first insulation layer IL1 and the second insulation layer IL2 and the minimum angle θ1 between the first through-surface SW-IL1 and the surface on which the first insulation layer IL1 is disposed. When the minimum angle θ1 between the first through-surface SW-IL1 and the surface on which the first insulation layer IL1 is disposed is less than about 60° or greater than about 80°, the first light LT1-2 may not be refracted or reflected in the third direction DR3. However, this is only an example. In an embodiment, the first light LT1-2 may be provided to the third insulation layer IL3-1 from the light emitting layer EM. The first light LT1-2 may be refracted or reflected in the third direction DR3 from the second through-surface SW-IL31 due to the refractive index difference between the third insulation layer IL3-1 and the fourth insulation layer IL4-1 and the minimum angle θ21 between the second through-surface SW-IL31 and the surface on which the third insulation layer IL3-1 is disposed. When the minimum angle θ21 between the second through-surface SW-IL31 and the surface on which the third insulation layer IL3-1 is disposed is less than about 60° or greater than about 80°, the first light LT1-2 may not be refracted or reflected in the third direction DR3.

The second light LT2-2 may be light having an incident path toward a lower surface of the third insulation layer IL3-1. The second light LT2-2 may be reflected from the lower surface of the third insulation layer IL3-1 due to the refractive index difference between the second insulation layer IL2 and the third insulation layer IL3-1. Accordingly, the second light LT2-2 may not be visible from the outside.

Figure 11:
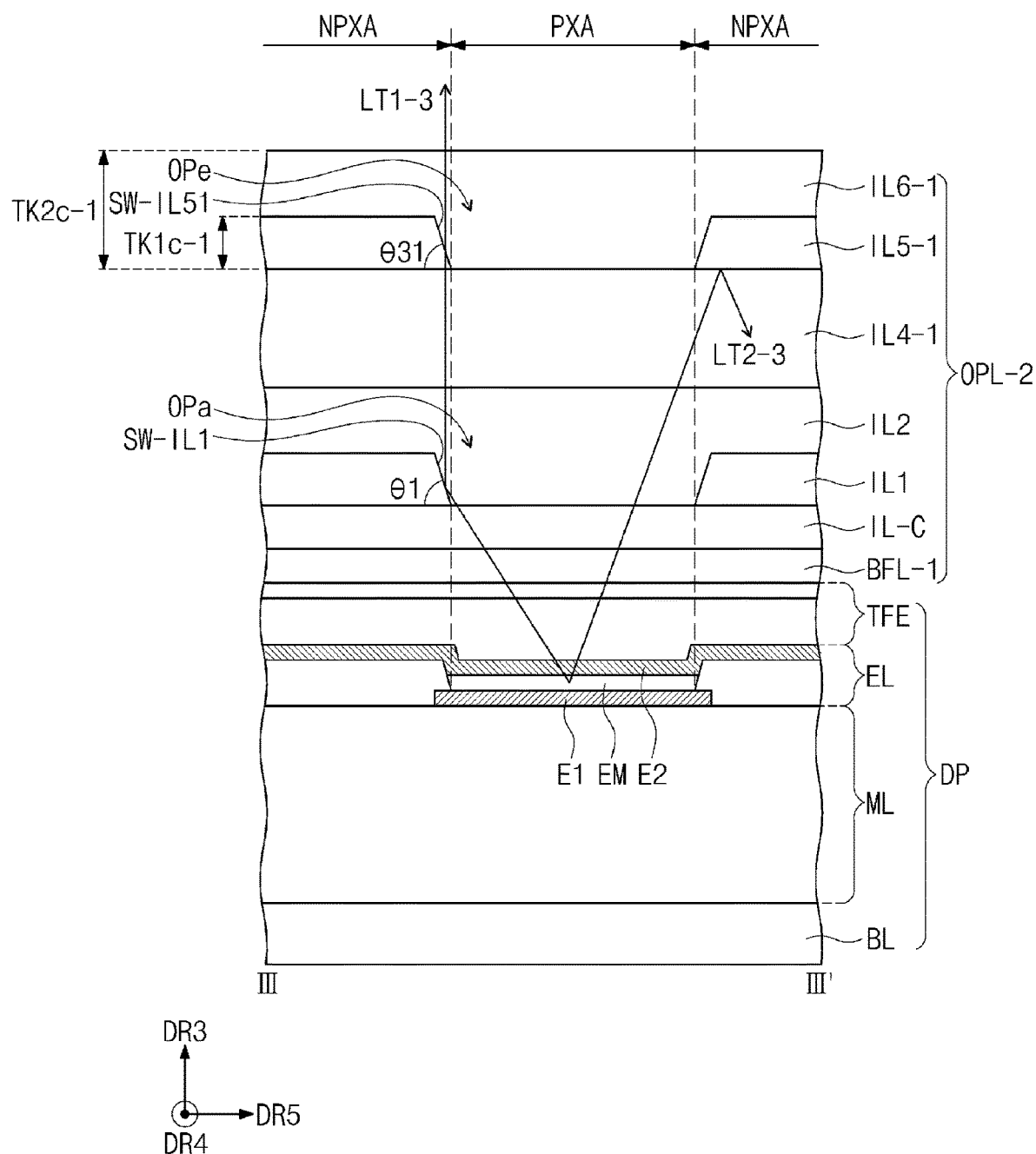
FIG. 11 is a schematic cross-sectional view taken along line of FIG. 9.

FIG. 11 is a schematic cross-sectional view taken along line III-III' of FIG. 9. The same reference numerals are given to the elements described with reference to FIG. 6 to FIG. 8, and the descriptions thereof are omitted.

Referring to FIG. 9 to FIG. 11, the fifth insulation layer IL5-1 may be disposed on the fourth insulation layer IL4-1. The fifth insulation layer IL5-1 and the first insulation layer IL1 may be formed of the same material. The fifth insulation layer IL5-1 may have third openings spaced apart in the fifth direction DR5 and extended in the fourth direction DR4 on a plane. The fifth insulation layer IL5-1 may have a stripe shape on a plan view. FIG. 11 illustrates one third opening OPe.

The fifth insulation layer IL5-1 may have a refractive index in a range of about 1.45 to about 1.55. The fifth insulation layer IL5-1 may have a thickness TK1c-1 in a range of about 1.5 µm to about 5 µm. The fifth insulation layer IL5-1 may include a third through-surface SW-IL51 defining the third opening OPe. A minimum angle θ31 between the third through-surface SW-IL51 and a surface on which the fifth insulation layer IL5-1 is disposed may be in a range of about 60° to about 80°. The surface on which the fifth insulation layer IL5-1 is disposed may be an upper surface of the fourth insulation layer IL4-1.

The sixth insulation layer IL6-1 may cover the fourth insulation layer IL4-1 and the fifth insulation layer IL5-1. The sixth insulation layer IL6-1 and the second insulation layer IL2 may be formed of the same material. The sixth insulation layer IL6-1 may have a refractive index greater than the refractive index of the fifth insulation layer IL5-1. The sixth insulation layer IL6-1 may have a refractive index in a range of about 1.65 to about 1.80. The sixth insulation layer IL6-1 may have a maximum thickness TK2c-1 greater than the thickness TK1c-1 of the fifth insulation layer IL5-1. The maximum thickness TK2c-1 of the sixth insulation layer IL6-1 may be in a range of about 3 µm to about 20 µm. The sixth insulation layer IL6-1 may overlap each of the first opening OPa and the third opening OPe on a plane. The sixth insulation layer IL6-1 may be filled in the third opening OPe. The sixth insulation layer IL6-1 may provide a flat surface on an upper portion thereof.

For ease of explanation, FIG. 11 illustrates a first light LT1-3 and a separate second light LT2-3 according to the path of light generated in the light emitting layer EM. The first light LT1-3 and the second light LT2-3 may be emitted in the lateral direction. The first light LT1-3 may be provided to the first insulation layer IL1 from the light emitting layer EM. The first light LT1-3 may be refracted or reflected in the third direction DR3 from the first through-surface SW-IL1 due to the refractive index difference between the first insulation layer IL1 and the second insulation layer IL2 and the minimum angle θ1 between the first through-surface SW-IL1 and the surface on which the first insulation layer IL1 is disposed. When the minimum angle θ1 between the first through-surface SW-IL1 and the surface on which the first insulation layer IL1 is disposed is less than about 60° or greater than about 80°, the first light LT1-3 may not be refracted or reflected in the third direction DR3. However, this is only an example. In an embodiment, the first light LT1-3 may be provided to the fifth insulation layer IL5-1 from the light emitting layer EM. At this time, the first light LT1-3 may be refracted or reflected in the third direction DR3 from the third through-surface SW-IL51 due to the refractive index difference between the fifth insulation layer IL5-1 and the sixth insulation layer IL6-1 and the minimum angle θ31 between the third through-surface SW-IL51 and the surface on which the first insulation layer IL5-1 is disposed. When the minimum angle θ31 between the third through-surface SW-IL51 and the surface on which the fifth insulation layer IL5-1 is disposed is less than about 60° or greater than about 80°, the first light LT1-3 may not be refracted or reflected in the third direction DR3.

The second light LT2-3 may be light having an incident path toward a lower surface of the fifth insulation layer IL5-1. The second light LT2-3 may be reflected from the lower surface of the fifth insulation layer IL5-1 due to the refractive index difference between the fourth insulation layer IL4-1 and the fifth insulation layer IL5-1. Accordingly, the second light LT2-3 may not be visible from the outside.

Light emitted from the light emitting layer EM of the display device DD (see FIG. 1) may be refracted or reflected due to the refractive index difference(es) among the first insulation layer IL1 to the sixth insulation layer IL6, so that light path(s) may be changed. For example, the light path may be changed in the third direction DR3 or in a direction close to the third direction DR3, or in a direction in which the light is not visible. Due to the changed light path, the light emitting efficiency of the display device DD (see FIG. 1) may be improved and the straightness of the light in the front direction may be improved. Accordingly, the display device DD (see FIG. 1) may have improved light efficiency.

Figure 12:
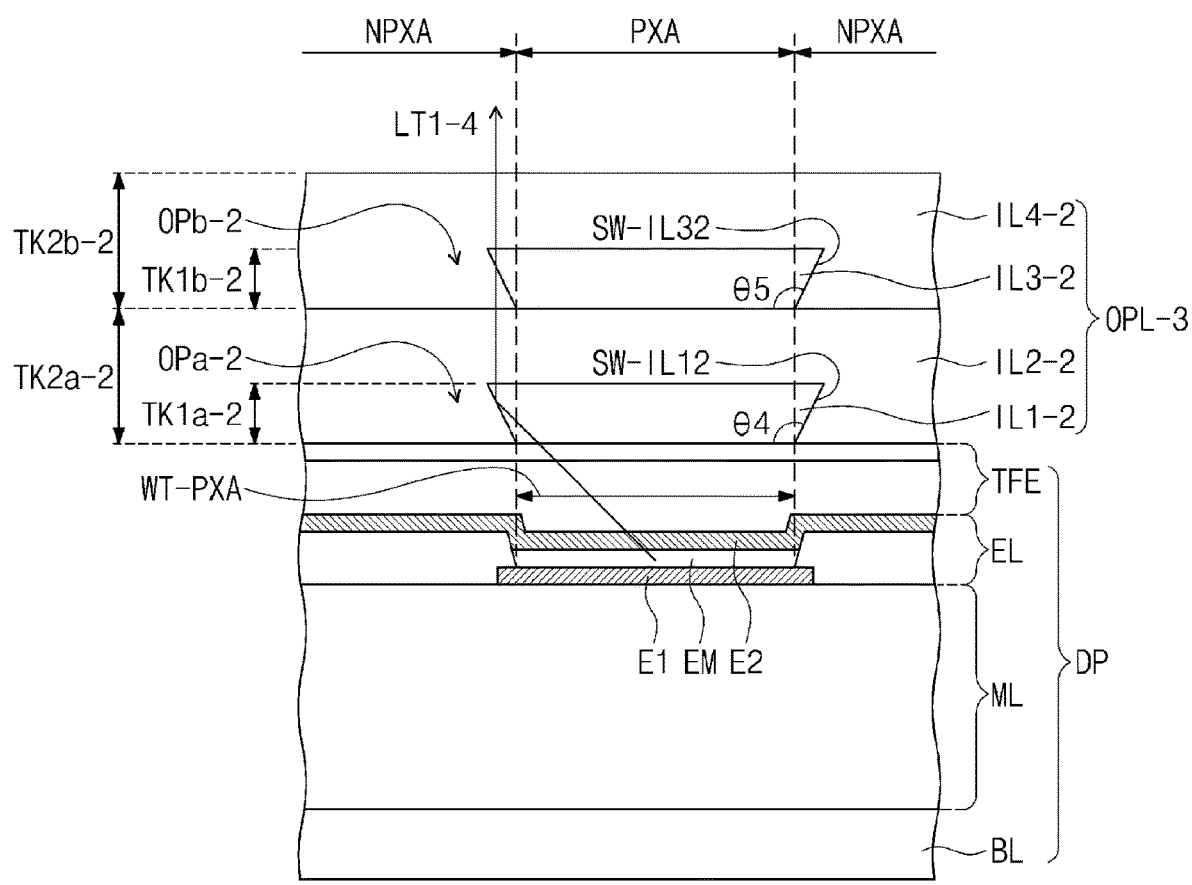
FIG. 12 is a schematic cross-sectional view of a region corresponding to the region taken along line I-I' of FIG. 6.
Figure 12:
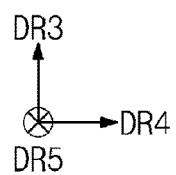

FIG. 12 is a schematic cross-sectional view of a region corresponding to the region taken along line I-I' of FIG. 6. The same reference numerals are given to the elements described with reference to FIG. 6 and FIG. 7, and the descriptions thereof are omitted.

Referring to FIG. 12, an optical layer OPL-3 may be disposed on the display panel DP. The optical layer OPL-3 may include a first insulation layer IL1-2, a second insulation layer IL2-2, a third insulation layer IL3-2, and a fourth insulation layer IL4-2.

The first insulation layer IL1-2 may be disposed on the display panel DP. The first insulation layer IL1-2 may include a first organic matter. In an embodiment, the first organic matter may include a porous acrylic resin. However, this is only an example. The first organic matter is not limited to the above example. The first insulation layer IL1-2 may have first openings OPa-2 defined in a region overlapping the non-light emitting region NPXA.

The first insulation layer IL1-2 may have a first refractive index. For example, the first refractive index may be in a range of about 1.45 to about 1.55. The first insulation layer IL1-2 may have a thickness in a range of about 1.5 μm to about 5 μm. The first insulation layer IL1-2 may include a first through-surface SW-IL12 defining the first opening OPa-2. A maximum angle θ4 between the first through-surface SW-IL12 and a surface on which the first insulation layer IL1-2 is disposed may be in a range of about 90° to about 120°. The surface on which the first insulation layer IL1-2 is disposed may be an upper surface of the display panel DP.

The second insulation layer IL2-2 may cover the display panel DP and the first insulation layer IL1-2. The second insulation layer IL2-2 may include a second organic matter different from the first organic matter. The second organic matter may include porous zirconia. However, this is only an example. The second organic matter is not limited to the above example. The second insulation layer IL2-2 may have a second refractive index. The second refractive index may be less than the first refractive index. For example, the second refractive index may be in a range of about 1.1 to about 1.3. The second insulation layer IL2-2 may have a maximum thickness TK2a-2 greater than the thickness TK1a-2 of the first insulation layer IL1-2. The maximum thickness TK2a-2 of the second insulation layer IL2-2 may be in a range of about 3 μm to about 20 μm. The second insulation layer IL2-2 may overlap the first opening OPa-2 on a plane. The second insulation layer IL2-2 may be filled in the first opening OPa-2. The second insulation layer IL2-2 may provide a flat surface on an upper portion thereof.

The third insulation layer IL3-2 may be disposed on the second insulation layer IL2-2. The third insulation layer IL3-2 and the first insulation layer IL1-2 may include the same material. The third insulation layer IL3-2 may have a second opening OPb-2 defined in a region overlapping the non-light emitting region NPXA.

The third insulation layer IL3-2 may have the first refractive index. The third insulation layer IL3-2 may have a thickness TK1b-2 in a range of about 1.5 μm to about 5 μm. The third insulation layer IL3-2 may include a second through-surface SW-IL32 defining the second opening OPb-2. A maximum angle θ5 between the second through-surface SW-IL32 and a surface on which the third insulation layer IL3-2 is disposed may be in a range of about 90° to about 120°. The surface on which the third insulation layer IL3-2 is disposed may be an upper surface of the second insulation layer IL2-2.

The fourth insulation layer IL4-2 may cover the second insulation layer IL2-2 and the third insulation layer IL3-2. The fourth insulation layer IL4-2 and the second insulation layer IL2-2 may include the same material. The fourth insulation layer IL4-2 may have the second refractive index. The fourth insulation layer IL4-2 may have a maximum thickness TK2b-2 greater than the thickness TK1b-2 of the third insulation layer IL3-2. The maximum thickness TK2b-2 of the fourth insulation layer IL4-2 may be in a range of about 3 μm to about 20 μm. The fourth insulation layer IL4-2 may overlap each of the first opening OPa-2 and the second opening OPb-2 on a plane. The fourth insulation layer IL4-2 may be filled in the second opening OPb-2. The fourth insulation layer IL4-2 may provide a flat surface on an upper portion thereof.

For ease of explanation, FIG. 12 illustrates a first light LT1-4 and a separate second light LT2-4 according to the path of light generated in the light emitting layer EM. The first light LT1-4 may be emitted in the lateral direction. The first light LT1-4 may be provided to the first insulation layer IL1-2 from the light emitting layer EM. The first light LT1-4 may be refracted or reflected in the third direction DR3 from the first through-surface SW-IL12 due to the refractive index difference between the first insulation layer IL1-2 and the second insulation layer IL2-2 and the minimum angle θ4 between the first through-surface SW-IL12 and the surface on which the first insulation layer IL1-2 may be disposed. When the maximum angle θ4 between the first through-surface SW-IL12 and the surface on which the first insulation layer IL1-2 is disposed is less than about 90° or greater than about 120°, the first light LT1-4 may not be refracted or reflected in the third direction DR3. However, this is only an example. In an embodiment, the first light LT1-4 may be provided to the third insulation layer IL3-2 from the light emitting layer EM. At this time, the first light LT1-4 may be refracted or reflected in the third direction DR3 from the second through-surface SW-IL32 due to the refractive index difference between the third insulation layer IL3-2 and the fourth insulation layer IL4-2 and the maximum angle θ5 between the second through-surface SW-IL32 and the surface on which the third insulation layer IL3-2 is disposed. When the maximum angle θ5 between the second through-surface SW-IL32 and the surface on which the third insulation layer IL3-2 is disposed is less than about 90° or greater than about 120°, the first light LT1-4 may not be refracted or reflected in the third direction DR3.

Light emitted from the light emitting layer EM of the display device DD (see FIG. 1) may be refracted or reflected due to the refractive index difference between the first insulation layer IL1-2 and the second insulation layer IL2-2 and the refractive index difference between the third insulation layer IL3-2 and the fourth insulation layer IL4-2, so that a light path may be changed. For example, the light path may be changed in the third direction DR3 or in a direction close to the third direction DR3. Due to the changed light path, the light emitting efficiency of the display device DD (see FIG. 1) may be improved and the straightness of the light in the front direction may be improved. Accordingly, the display device DD (see FIG. 1) may have improved light efficiency.

Figure 13:
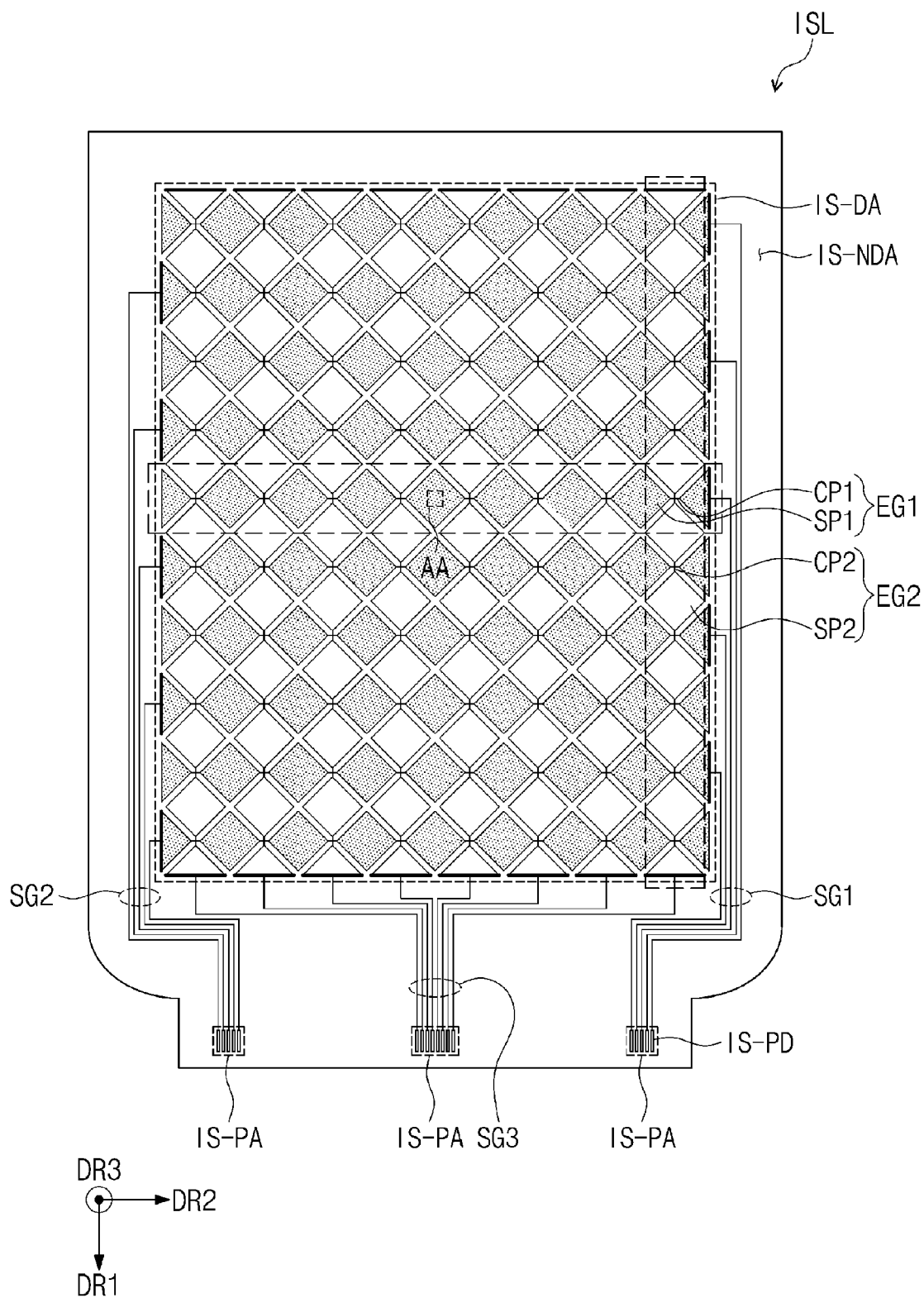
FIG. 13 is a plan view of an input sensing layer according to an embodiment.

FIG. 13 is a plan view of an input sensing layer according to an embodiment. The input sensing layer ISL to be described hereinafter may be equally applied to the input sensing panel ISP (see FIG. 2C).

Referring to FIG. 13, the input sensing layer ISL may include a sensing region IS-DA corresponding to the display region DP-DA of the display panel DP illustrated in FIG. 3 and a line region IS-NDA corresponding to the non-display region DP-NDA of the same.

The input sensing layer ISL may include first sensing electrodes EG1, second sensing electrodes EG2, a first signal line group SG1 electrically connected to each or some corresponding electrodes among the first sensing electrodes EG1, a second signal line group SG2 electrically connected to each of other electrodes, and a third signal line group SG3 electrically connected to the second sensing electrodes EG2.

FIG. 13 illustrates the first signal line group SG1 and the second signal line group SG2 being disposed having the sensing region IS-DA therebetween. However, in an embodiment, the first signal line group SG1 and the second signal line group SG2 may be disposed on the same side of the sensing region IS-DA. In other embodiments, each of the first signal line group SG1 and the second signal line group SG2 may be connected to the first sensing electrodes EG1 in a double routing structure.

The first sensing electrodes EG1 and the second sensing electrodes EG2 may be disposed in the sensing region IS-DA. The first signal line group SG1, the second signal line group SG2, and the third signal line group SG3 may be disposed in the line region IS-NDA.

In the embodiment, the input sensing layer ISL may be a capacitive touch sensor which senses an external input in a mutual cap manner. Any one of the first sensing electrodes EG1 and the second sensing electrodes EG2 may receive a detection signal, and another one thereof may output the amount of change in capacitance between the first sensing electrodes EG1 and the second sensing electrodes EG2 as an output signal.

Each of the first sensing electrodes EG1 may be extended along the second direction DR2. The first sensing electrodes EG1 may be disposed spaced apart in the first direction DR1. Each of the second sensing electrodes EG2 may be extended along the first direction DR1. The second sensing electrodes EG2 may be disposed spaced apart in the second direction DR2.

The first sensing electrodes EG1 may include first sensor units SP1 and first connection units CP1. The first sensor units SP1 may be arranged along the second direction DR2. Each of the first connection units CP1 may connect two adjacent first sensor units SP1 among the first sensor units SP1.

The second sensing electrodes EG2 may include second sensor units SP2 and second connection units CP2. The second sensor units SP2 may be arranged along the first direction DR1. Each of the second connection units CP2 may connect two adjacent second sensor units SP2 among the second sensor units SP2.

The first signal line group SG1, the second signal line group SG2, and the third signal line group SG3 may be electrically connected to corresponding signal pads IS-PD. In the line region IS-NDA, a region in which the signal pads IS-PD are disposed may be defined as a pad region IS-PA. A circuit board (not shown) may be connected to the pad region IS-PA.

Figure 14:
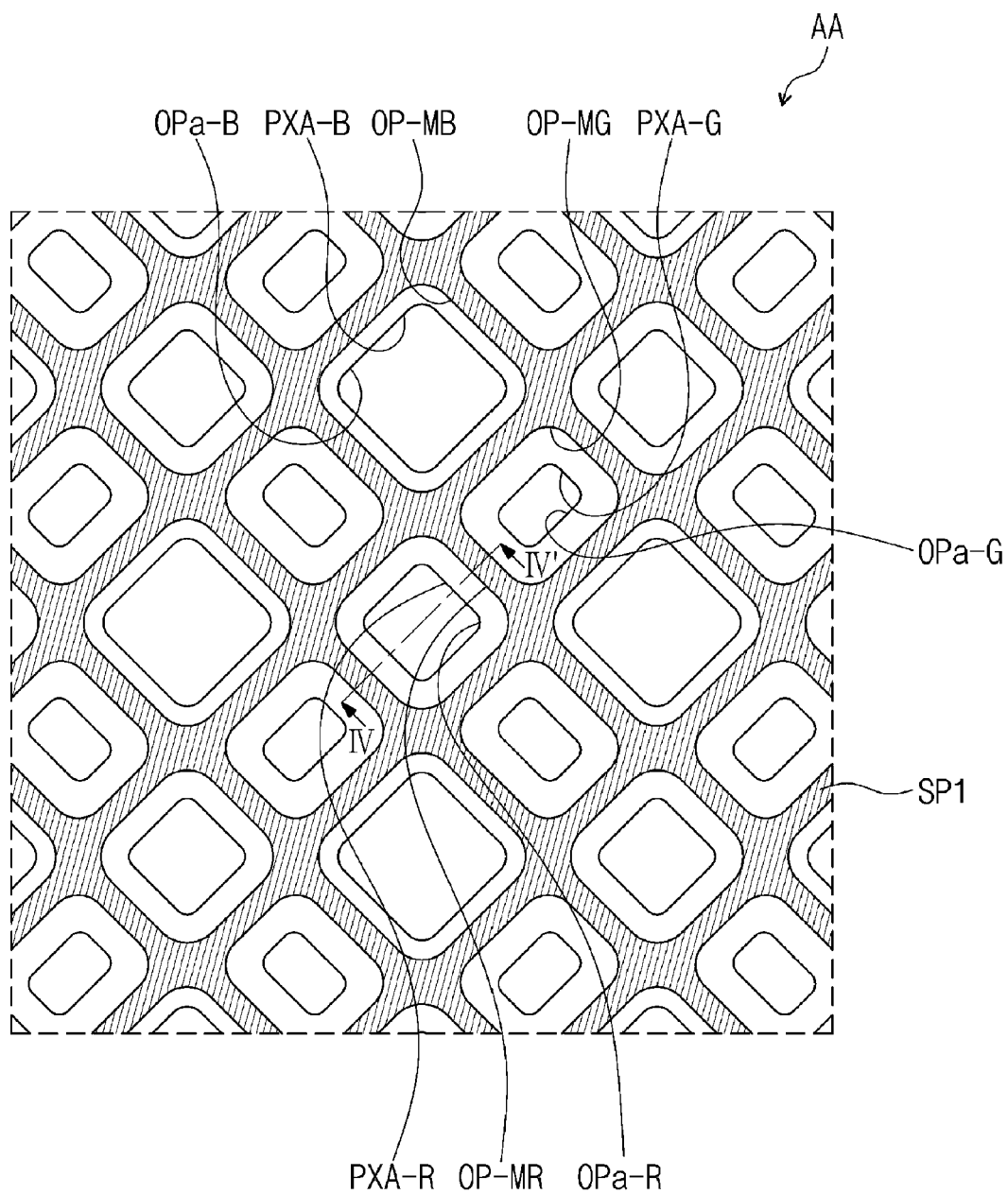
FIG. 14 is a plan view of illustrating an enlarged view of region AA of FIG. 13.
Figure 14:
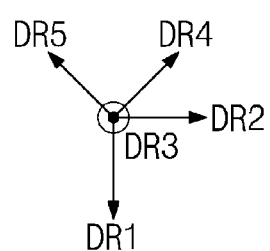

FIG. 14 is a plan view of illustrating an enlarged view of region AA corresponding to FIG. 13. FIG. 14 illustrates the arrangement relationship of a first light emitting region PXA-R, a second light emitting region PXA-B, and a third light emitting region PXA-G. The first light emitting region PXA-R, the second light emitting region PXA-B, and the third light emitting region PXA-G may be defined the same as the light emitting region PXA described with reference to FIG. 5.

Referring to FIG. 14, in the embodiment, the first light emitting region PXA-R, the second light emitting region PXA-B, and the third light emitting region PXA-G may have different areas. The first light emitting region PXA-R may have a first area, the second light emitting region PXA-B may have a second area, and the third light emitting region PXA-G may have a third area. The second area may be greater than the first area, and the first area may be greater than the third area.

The pixels PX described with reference to FIG. 3 may include a red pixel for generating red light, a blue pixel for generating blue light, and a green pixel for generating green light. In the embodiment, the first light emitting region PXA-R may correspond to the red pixel, the second light emitting region PXA-B may correspond to the blue pixel, and the third light emitting region PXA-G may correspond to the green pixel.

The first light emitting region PXA-R and the second light emitting region PXA-B may be alternately arranged along the second direction DR2. Multiple third light emitting regions PXA-G may be provided in an embodiment, and the multiple third light emitting regions PXA-G may be arranged along the first direction DR1 and the second direction DR2. The first light emitting region PXA-R and the third light emitting region PXA-G may be alternately arranged along the fourth direction DR4. The second light emitting region PXA-B and the third light emitting region PXA-G may be alternately arranged along the fourth direction DR4.

FIG. 14 illustrates the first light emitting region PXA-R, the second light emitting region PXA-B, and the third light emitting region PXA-G being arranged in a pentile form as an example. However, the embodiment is not limited thereto. For example, the first light emitting region PXA-R, the second light emitting region PXA-B, and the third light emitting region PXA-G may be arranged in a stripe form. The stripe form may mean that the first light emitting region PXA-R, the second light emitting region PXA-B, and the third light emitting region PXA-G are alternately arranged along the second direction DR2, and same light emitting regions are arranged in the first direction DR1.

Each of the first sensor units SP1 and the second sensor units SP2 (see FIG. 13) may have a mesh shape. The first sensor units SP1 and the second sensor units SP2 may each have openings OP-MR, OP-MG, and OP-MB. Accordingly, on a plane or on a plan view, the first sensor units SP1 and the second sensor units SP2 (see FIG. 13) may not overlap the first light emitting region PXA-R, the second light emitting region PXA-B, and the third light emitting region PXA-G. For example, regions corresponding to the first light emitting region PXA-R may have first openings OP-MR, regions corresponding to the second light emitting region PXA-B may have second openings OP-MB, and regions corresponding to the third light emitting region PXA-G may have third openings OP-MG.

Figure 15:
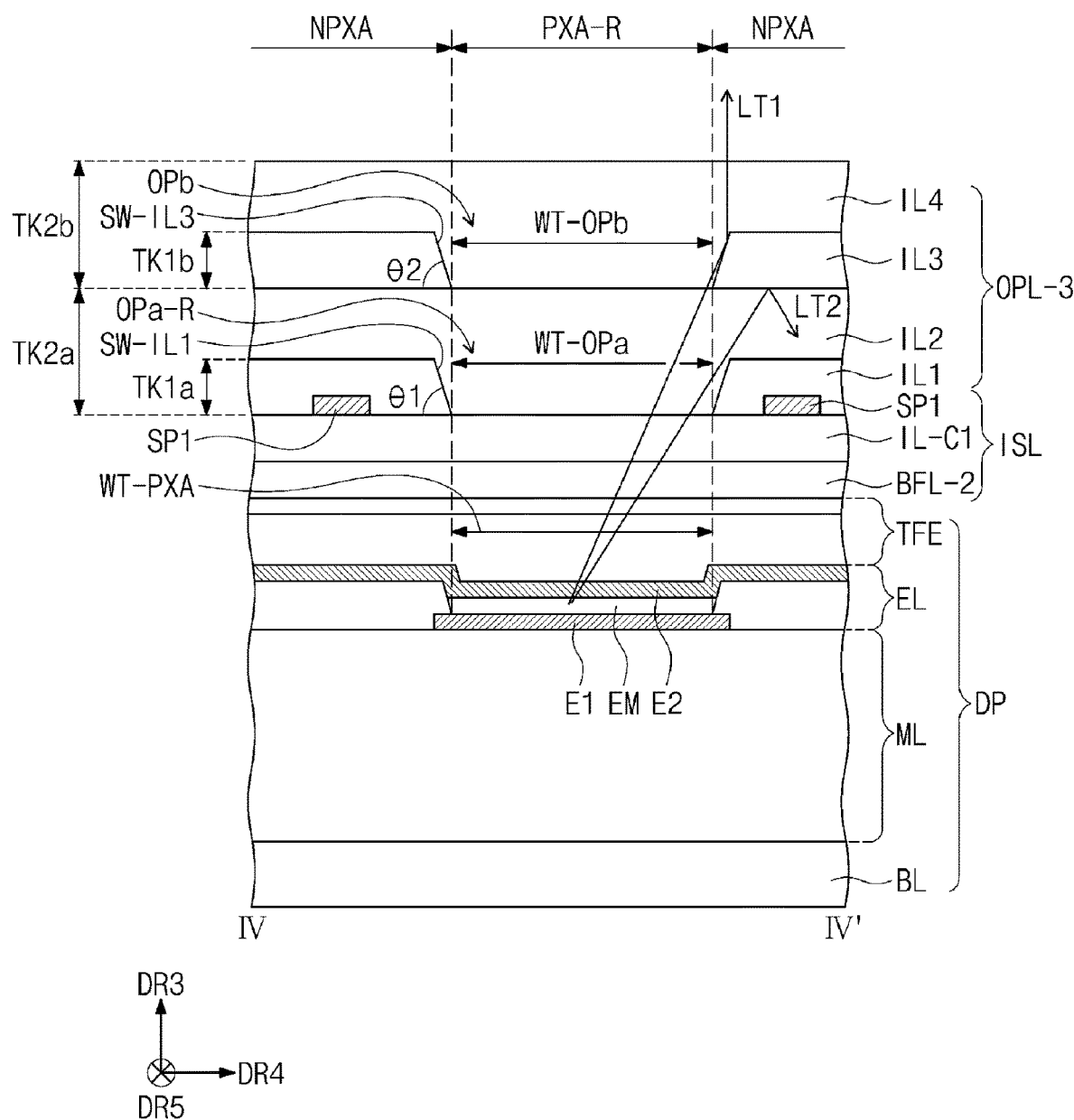
FIG. 15 is a schematic cross-sectional view of a region taken along line IV-IV' of FIG. 14.

FIG. 15 is a schematic cross-sectional view of a region taken along line IV-IV' of FIG. 14. The same reference numerals are given to the elements described with reference to FIG. 7, and the descriptions thereof are omitted.

Referring to FIG. 15, the input sensing layer ISL may be disposed between the display panel DP and the optical layer OPL-3. The input sensing layer ISL may include a buffer layer BFL-2, an interlayer insulation layer IL-C1, and the first sensor units SP1.

The buffer layer BFL-2 may be disposed on the encapsulation layer TFE. The buffer layer BFL-2 may include an inorganic matter. For example, the inorganic matter may be silicon nitride. The first connection units CP1 may be disposed on the buffer layer BFL-2. In an embodiment, the buffer layer BFL-2 may be omitted.

The interlayer insulation layer IL-C1 may be disposed on the buffer layer BFL-2. The interlayer insulation layer IL-C1 may include an inorganic matter. For example, the inorganic matter may be silicon nitride.

The first sensor units SP1, the second sensor units SP2 (see FIG. 13), and the second connection units CP2 (see FIG. 13) may be disposed on the interlayer insulation layer IL-C1. FIG. 15 illustrates the first sensor units SP1 being disposed on the interlayer insulation layer IL-C1.

The first insulation layer IL1 may be disposed on the interlayer insulation layer IL-C1. The first insulation layer IL1 may cover the first sensor units SP1. The first insulation layer IL1 may have a first opening OPa-R defined in a region overlapping the first light emitting region PXA-R. Referring to FIG. 14, a second opening OPa-B defined in a region overlapping the second light emitting region PXA-B and a third opening OPa-G defined in a region overlapping the third light emitting region PXA-G are illustrated. A first area of the first opening OPa-R, a second area of the second opening OPa-B, and a third area of the third opening OPa-G may be different from each other on a plane or on a plan view. The second area may be greater than the first area, and the first area may be greater than the third area.

According to the disclosure, a display device may include a first insulation layer having a first opening and having a first refractive index, a second insulation layer covering the first insulation layer and having a second refractive index greater than the first refractive index, a third insulation layer disposed on the second insulation layer, having a second opening, and having the first refractive index, and a fourth insulation layer covering the third insulation layer and having the second refractive index. Light emitted from a light emitting layer of the display device may be refracted or reflected at the boundary of each of the first insulation layer to the fourth insulation layer due to the refractive index difference, so that a light path may be changed. For example, the light path may be changed in a third direction or in a direction close to the third direction. Due to the changed light path, the light emitting efficiency of the display device may be improved and the straightness of the light in a front direction may be improved. Accordingly, the display device may have improved light efficiency.

Although the disclosure has been described with reference to embodiments, it will be understood by those skilled in the art that various changes in form and details may be made therein without departing from the spirit and scope of the disclosure. Accordingly, the technical scope of the disclosure is not intended to be limited to the contents set forth in the detailed description of the specification, but is intended to be defined by the appended claims.

What is claimed is:

1. A display device comprising:
   a display panel including a plurality of light emitting regions and a non-light emitting region adjacent to the plurality of light emitting regions;
   a first insulation layer disposed on the display panel, the first insulation layer having a first refractive index, and having a plurality of first openings defined in a region overlapping the plurality of light emitting regions;
   a second insulation layer covering the display panel and the first insulation layer and having a second refractive index greater than the first refractive index of the first insulation layer;
   a third insulation layer disposed on the second insulation layer, the third insulation layer having the first refractive index, and having a plurality of second openings defined in a region overlapping the plurality of light emitting regions; and
   a fourth insulation layer covering the second insulation layer and the third insulation layer and having the second refractive index.

2. The display device of claim 1, wherein each of the second insulation layer and the fourth insulation layer overlaps the plurality of first openings on a plane.

3. The display device of claim 1, wherein the first refractive index is in a range of about 1.45 to about 1.55, and the second refractive index is in a range of about 1.65 to about 1.80.

4. The display device of claim 1, wherein
   the first insulation layer and the third insulation layer comprise a first organic matter, and
   the second insulation layer and the fourth insulation layer comprise a second organic matter different from the first organic matter.

5. The display device of claim 4, wherein the first organic matter comprises an acrylic resin.

6. The display device of claim 4, wherein the second organic matter comprises zirconia.

7. The display device of claim 1, wherein a thickness of the first insulation layer is in a range of about 1.5 μm to about 5 μm, and a maximum thickness of the second insulation layer is in a range of about 3 μm to about 20 μm.

8. The display device of claim 1, wherein
   the first insulation layer comprises a first through-surface defining each of the plurality of first openings, and
   an angle between the first through-surface and a surface on which the first insulation layer is disposed is in a range of about 60° to about 80°.

9. The display device of claim 8, wherein an absolute value of the difference between a width of each of the plurality of first openings and a width of each of the plurality of light emitting regions is about 3 μm or less.

10. The display device of claim 1, further comprising:
    a fifth insulation layer disposed on the fourth insulation layer, the fifth insulation layer having the first refractive index, and having a plurality of third openings defined in a region overlapping the plurality of light emitting regions; and
    a sixth insulation layer covering the fourth insulation layer and the fifth insulation layer and having the second refractive index.

11. The display device of claim 10, wherein
    the plurality of second openings are extended in a first direction and spaced apart in a second direction crossing the first direction on a plane, and
    the plurality of third openings are extended in the second direction and spaced apart in the first direction on the plane.

12. The display device of claim 1, further comprising an input sensing layer between the display panel and the first insulation layer.

\* \* \* \* \*